(12) United States Patent
Oohira et al.

(10) Patent No.: US 7,511,484 B2
(45) Date of Patent: Mar. 31, 2009

(54) MAGNETIC SENSOR AND METHOD FOR DETECTING MAGNETIC FIELD

(75) Inventors: Satoshi Oohira, Ichinomiya (JP); Tetsuo Fujii, Toyohashi (JP)

(73) Assignee: DENSO CORPORATION, Kariya (JP)

( * ) Notice: Subject to any disclaimer, the term of this patent is extended or adjusted under 35 U.S.C. 154(b) by 0 days.

(21) Appl. No.: 11/649,280

(22) Filed: Jan. 4, 2007

(65) Prior Publication Data
US 2007/0290682 A1  Dec. 20, 2007

(30) Foreign Application Priority Data
Jan. 13, 2006 (JP) .............................. 2006-006465
Oct. 11, 2006 (JP) .............................. 2006-278087

(51) Int. Cl.
*G01R 33/07* (2006.01)
*G01B 7/14* (2006.01)
*H01L 43/06* (2006.01)

(52) U.S. Cl. ..................................... 324/251; 324/207.2

(58) Field of Classification Search .............. 324/207.2, 324/249, 251, 252; 257/421–427; 438/3; 338/32 H
See application file for complete search history.

(56) References Cited

U.S. PATENT DOCUMENTS 6,278,271 B1 * 8/2001 Schott ........................ 324/251

2005/0230770 A1 * 10/2005 Oohira ........................ 257/421

FOREIGN PATENT DOCUMENTS

| DE | 101 50 950 | 6/2003 |
|----|------------|--------|
| JP | A-2005-259803 | 9/2005 |
| JP | A-2005-333103 | 12/2005 |

OTHER PUBLICATIONS

"Three-Dimensional Integrated Magnetic Sensor." *Journal of IEE Japan C.* vol. 109, No. 7(1989): pp. 483-490.
K. Maenaka: "Piezoresistive effect in vertical hall cell", Electronics Letters, 1993, vol. 29, No. 4, pp. 381-382.
Office Action issued from the Ferman Patent and Trademark Office in the corresponding application No. 10 2006 061 883.1-33 dated Jul. 16, 2008 (English translation enclosed).

* cited by examiner

*Primary Examiner*—Kenneth J Whittington
(74) *Attorney, Agent, or Firm*—Posz Law Group, PLC

(57) ABSTRACT

A magnetic sensor includes: a substrate; a semiconductor region; a magnetic field detection portion; a pair of first electrodes; and two pairs of second electrodes. One pair of second electrodes includes first and second terminals, and the other pair includes third and fourth terminals. The first and third terminals are disposed on one side, and the second and fourth terminals are disposed on the other side. The first and fourth terminals are electrically coupled, and the second and third terminals are electrically coupled. The magnetic field detection portion and the first and second electrodes provide a vertical Hall element. One of the first and second electrodes supplies a driving current, and the other one detects the Hall voltage.

32 Claims, 23 Drawing Sheets

| CURRENT DIRECTION | $V_H$ DETECTION |
|---|---|
| V1→V3 | V2—V4 |
| V2→V4 | V3—V1 |
| V3→V1 | V4—V2 |
| V4→V2 | V1—V3 |

MAGNETIC SENSOR AND METHOD FOR DETECTING MAGNETIC FIELD

CROSS REFERENCE TO RELATED APPLICATIONS

This application is based on Japanese Patent Applications No. 2006-6465 filed on Jan. 13, 2006, and No. 2006-278087 filed on Oct. 11, 2006, the disclosures of which are incorporated herein by reference.

FIELD OF THE INVENTION

The present invention relates to a magnetic sensor and a method for detecting a magnetic field.

BACKGROUND OF THE INVENTION

In recent years, the magnetic sensor using the vertical Hall element for detecting a horizontal magnetic field component with respect to the surface of a substrate is proposed in, for example, "Three-dimensional integrated magnetic sensor", Journal of IEE Japan C, pp. 483-490, No. 7, Vol. 109, 1989. FIGS. 26A and 26B are schematic constructional views showing one example of the above vertical Hall element, where FIG. 26A is a plan view, and FIG. 26B is a cross-sectional view along line XXVIB-XXVIB of FIG. 26A.

As shown in FIGS. 26A and 26B, a Hall element 30 of the vertical type has a semiconductor substrate 31 constructed by, e.g., silicon of P-type, and a semiconductor layer 32. The semiconductor layer 32 is constructed by silicon of N-type formed by, e.g., epitaxial growth on a burying layer 36 formed by introducing impurities of N-type on the surface of the semiconductor substrate 31. The burying layer 36 is constructed by N-type of concentration higher than that of the semiconductor layer 32. Further, electrodes 35a to 35c for supplying a driving electric current and electrodes 35d and 35e for detecting a Hall voltage are arranged on the semiconductor layer 32. Here, the electrode 35a is arranged in a shape nipped by both electrodes 35b, 35c and electrodes 35d, 35e arranged in a shape perpendicular to these electrodes 35b and 35c. Further, N$^+$ diffusion layers 33a to 33e constructed by N-type of concentration higher than that of the semiconductor layer 32 are formed on the surface of the semiconductor layer 32 so as to form ohmic contact with these electrodes 35a to 35e. Further, a diffusion area 34 of P-type is formed in the semiconductor layer 32 in a shape surrounding the circumference of all the electrodes 35a to 35e. Further, diffusion areas 34a, 34b of P-type are formed inside the diffusion area 34 in a shape surrounding the circumference of electrodes 35a, 35d, 35e. Here, diffusion areas 34a, 34b are extended in a mode connected to the burying layer 36 formed on a bottom face of the semiconductor layer 32. Further, the diffusion area 34 is extended in a mode connected to the semiconductor substrate 31. In this Hall element 30, a portion partitioned by their diffusion areas 34a, 34b and the burying layer 36 becomes a so-called magnetic detecting portion HP. Namely, in this Hall element 30, magnetism (magnetic field) applied to this magnetic detecting portion HP is detected. For example, when a constant electric current is respectively flowed between electrodes 35a and 35b and between electrodes 35a and 35c, the electric current including a component perpendicular to a substrate surface is flowed from the electrode 35a to the burying layer 36. At this time, when a magnetic field including a horizontal component with respect to the substrate surface is applied to this Hall element 30, a Hall voltage is generated between electrodes 35d and 35e by the Hall effect. Therefore, the horizontal magnetic field component can be calculated by detecting this Hall voltage through these electrodes 35d and 35e.

The above Hall element 30 of the vertical type is complicated in structure in comparison with a lateral Hall element. Accordingly, an unbalance of an electric potential distribution is caused by an influence such as an alignment shift, the shape of an element, etc., and an offset voltage (unbalance voltage) is easily caused. The offset voltage corresponds to an output voltage when no magnetic field is applied.

Further, as shown in FIGS. 27A and 27B, electrodes 45a, 45b for supplying the driving electric current and electrodes 45c, 45d for detecting the Hall voltage are respectively arranged at four corners of a portion surrounded by a diffusion area 43 in opposite shapes on a semiconductor layer 42 in the Hall element 40 of the lateral type. Terminals S, G, Va, Vb are respectively electrically connected to respective electrodes 45a to 45d. Accordingly, as shown in FIG. 27C, a magnetic field component perpendicular to the substrate surface is detected while terminals S, G (electrodes 45a, 45b) for supplying the driving electric current and terminals Va, Vb (electrodes 45c, 45d) for detecting the Hall voltage are replaced and a flowing direction of the driving electric current is switched in directions XXVIIA and XXVIIB (i.e., while a spinning current method is applied). Thus, the offset voltage can be reduced (canceled). FIGS. 27A to 27C are schematic constructional views showing one example of the conventional Hall element 40 of the lateral type, where FIG. 27A is a plan view, and FIG. 27B is a cross-sectional view along line L12-L12 of FIG. 27A, and FIG. 27C is a typical view for explaining the spinning current method. Reference numeral 41 within FIGS. 27A to 27C designates a semiconductor substrate constructed by e.g., silicon of P-type (first electric conductivity type). Reference numeral 42 designates a semiconductor layer constructed by silicon of N-type (second electric conductivity type) formed by e.g., epitaxial growth. Reference numeral 43 designates a diffusion area of P-type for separating the Hall element 40 from other elements. Reference numeral 44 designates contact areas 44a to 44d formed on the surface of the semiconductor layer 42 so as to form ohmic contact with electrodes 45a to 45d.

However, in the case of the above Hall element 30 of the vertical type, as shown in FIG. 26A, electrodes 35d, 35e for detecting the Hall voltage are arranged so as to nip one electrode 35a for supplying the electric current therebetween. Namely, four electrodes constructed by electrodes 35a, 35b (to 35c) for supplying the electric current and electrodes 35d, 35e for detecting the Hall voltage are asymmetrically arranged. Accordingly, even when a spinning current is performed, no offset voltage can be reduced as in the above Hall element 40 of the lateral type.

SUMMARY OF THE INVENTION

In view of the above-described problem, it is an object of the present disclosure to provide a magnetic sensor. It is another object of the present disclosure to provide a method for detecting a magnetic field.

According to a first aspect of the present disclosure, a magnetic sensor includes: a substrate; a semiconductor region disposed in the substrate and having a predetermined conductive type; a magnetic field detection portion disposed in the semiconductor region; a pair of first electrodes disposed on a surface of the semiconductor region; and two pairs of second electrodes disposed on the surface of the semiconductor region, wherein one pair of second electrodes sandwiches one of first electrodes, and the other pair of second electrodes sandwiches the other one of first electrodes. The one pair of second electrodes includes first and second terminals, and the other pair of second electrodes includes third and fourth terminals. The first and third terminals are disposed on one side of a line connecting between the first electrodes, and the second and fourth terminals are disposed on the other side of the line. The first and fourth terminals are electrically coupled with a first wiring, and the second and third terminals are electrically coupled with a second wiring. The magnetic field detection portion, the first electrodes and the second electrodes provide a vertical Hall element. The vertical Hall element generates a Hall voltage corresponding to a magnetic field when the magnetic field in parallel to the surface of the substrate is applied to the magnetic field detection portion, and a driving current is supplied to the magnetic field detection portion. One of the first and second electrodes supplies the driving current, and the other one of the first and second electrodes detects the Hall voltage.

In the above sensor, the Hall voltage is detected by switching the first and second electrodes between a driving current supply electrode and a Hall voltage detecting electrode so that an offset voltage of the sensor is reduced.

According to a second aspect of the present disclosure, a magnetic sensor includes: a substrate; a semiconductor region disposed in the substrate and having a predetermined conductive type; a magnetic field detection portion disposed in the semiconductor region; a first electrode having first, second and third pads, which are disposed on a surface of the semiconductor region and aligned on a line connecting between the first and third pads so that the first and third pads sandwich the second pad; and a second electrode having first to sixth terminals disposed on the surface of the semiconductor region, wherein the first and second terminals sandwich the first pad, the third and fourth terminals sandwich the second pad, and the fifth and sixth terminals sandwich the third pad. The first, third and fifth terminals are disposed on one side of a line connecting between the first and third pads, and the second, fourth and sixth terminals are disposed on the other side of the line. The first, fourth and fifth terminals are electrically coupled with a seventh wiring, and the second, third and sixth terminals are electrically coupled with an eighth wiring. The magnetic field detection portion, the first electrode and the second electrode provide a vertical Hall element. The vertical Hall element generates a Hall voltage corresponding to a magnetic field when the magnetic field in parallel to the surface of the substrate is applied to the magnetic field detection portion, and a driving current is supplied to the magnetic field detection portion. One of the first and second electrodes supplies the driving current, and the other one of the first and second electrodes detects the Hall voltage.

In the above sensor, the Hall voltage is detected by switching the first and second electrodes between a driving current supply electrode and a Hall voltage detecting electrode so that an offset voltage of the sensor is reduced.

According to a third aspect of the present disclosure, a method for detecting a magnetic field includes: supplying a driving current to a magnetic field detection portion, wherein the magnetic field detection portion is disposed in a semiconductor region having a predetermined conductive type, and wherein the semiconductor region is disposed in a substrate; and detecting a Hall voltage corresponding to the magnetic field, which is in parallel to a surface of the substrate and applied to the magnetic field detection portion. A pair of first electrodes is disposed on a surface of the semiconductor region. Two pairs of second electrodes are disposed on the surface of the semiconductor region. One pair of second electrodes sandwiches one of first electrodes, and the other pair of second electrodes sandwiches the other one of first electrodes. The one pair of second electrodes includes first and second terminals, and the other pair of second electrodes includes third and fourth terminals. The first and third terminals are disposed on one side of a line connecting between the first electrodes, and the second and fourth terminals are disposed on the other side of the line. The first and fourth terminals are electrically coupled with a first wiring, and the second and third terminals are electrically coupled with a second wiring. The magnetic field detection portion, the first electrodes and the second electrodes provide a vertical Hall element. The driving current is supplied to the magnetic field detection portion through one of the first and second electrodes so that the one of the first and second electrodes provides a driving current supply electrode. The Hall voltage is detected through the other one of the first and second electrodes so that the other one of the first and second electrodes provides a Hall voltage detecting electrode. The method further includes: switching the one of the first and second electrodes from the driving current supply electrode to the Hall voltage detecting electrode, and switching the other one of the first and second electrodes from the Hall voltage detecting electrode to the driving current supply electrode.

In the above method, the Hall voltage is detected by switching the first and second electrodes between a driving current supply electrode and a Hall voltage detecting electrode so that an offset voltage of the sensor is reduced.

According to a fourth aspect of the present disclosure, a method for detecting a magnetic field includes: supplying a driving current to a magnetic field detection portion, wherein the magnetic field detection portion is disposed in a semiconductor region having a predetermined conductive type, and wherein the semiconductor region is disposed in a substrate; and detecting a Hall voltage corresponding to the magnetic field, which is in parallel to a surface of the substrate and applied to the magnetic field detection portion. A first electrode includes first, second and third pads, which are disposed on a surface of the semiconductor region and aligned on a line connecting between the first and third pads so that the first and third pads sandwich the second pad. A second electrode includes first to sixth terminals disposed on the surface of the semiconductor region. The first and second terminals sandwich the first pad, the third and fourth terminals sandwich the second pad, and the fifth and sixth terminals sandwich the third pad. The first, third and fifth terminals are disposed on one side of a line connecting between the first and third pads, and the second, fourth and sixth terminals are disposed on the other side of the line. The first, fourth and fifth terminals are electrically coupled with a seventh wiring, and the second, third and sixth terminals are electrically coupled with an eighth wiring. The magnetic field detection portion, the first electrode and the second electrode provide a vertical Hall element. The driving current is supplied to the magnetic field detection portion through one of the first and second electrodes so that the one of the first and second electrodes provides a driving current supply electrode. The Hall voltage is detected through the other one of the first and second electrodes detects the Hall voltage so that the other one of the first and second electrodes provides a Hall voltage detecting electrode. The method further includes: switching the one of the first and second electrodes from the driving current supply electrode to the Hall voltage detecting electrode, and switching the other one of the first and second electrodes from the Hall voltage detecting electrode to the driving current supply electrode.

In the above method, the Hall voltage is detected by switching the first and second electrodes between a driving current supply electrode and a Hall voltage detecting electrode so that an offset voltage of the sensor is reduced.

BRIEF DESCRIPTION OF THE DRAWINGS

The above and other objects, features and advantages of the present invention will become more apparent from the following detailed description made with reference to the accompanying drawings. In the drawings.

DETAILED DESCRIPTION OF THE PREFERRED EMBODIMENTS

First Embodiment Mode

Figure 1A:
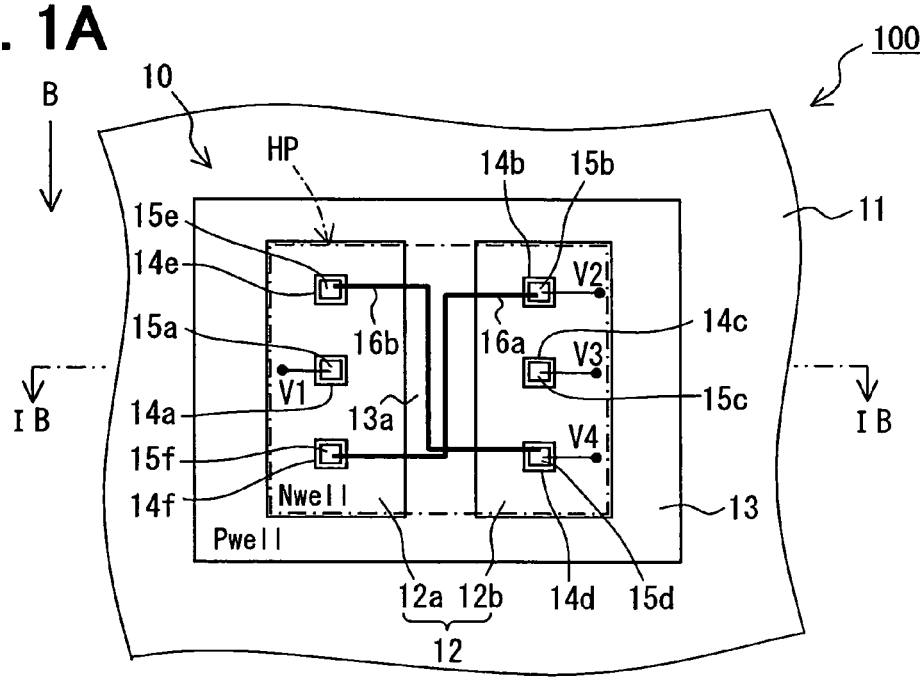
FIG. 1A is a plan view showing a magnetic sensor according to a first embodiment mode.
Figure 1B:
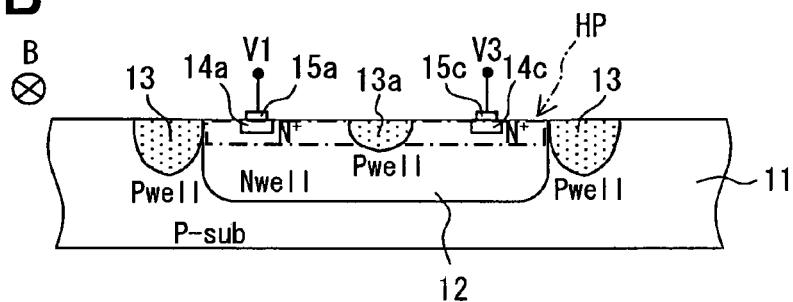
FIG. 1B is a cross sectional view showing the sensor taken along line IB-IB in FIG. 1A.

FIGS. 1A and 1B are views showing the schematic construction of a magnetic sensor in accordance with a first embodiment mode, where FIG. 1A is a plan view and FIG. 1B is a cross-sectional view along line IB-IB of FIG. 1A.

As shown in FIGS. 1A and 1B, a magnetic sensor 100 in accordance with this embodiment mode is constructed by forming a Hall element 10 of a vertical type in a substrate (semiconductor substrate) 11 constructed by a single electric conductivity type. The Hall element 10 is formed by utilizing a CMOS process. The present applicant previously discloses JP-A-2005-333103 as the magnetic sensor 100 (vertical Hall element 10) of such a construction. Accordingly, characteristic portions of this embodiment mode will next be centrally explained.

For example, the Hall element 10 of the vertical type is constructed by arranging a silicon substrate (P-sub) of P-type as a substrate 11 having a (100)-plane as a cut face, and a semiconductor area (N-well) 12 of N-type formed as a diffusion layer (well) by introducing electric conductivity type impurities of N-type on a substrate surface. This semiconductor area 12 is formed in a shape surrounded by the substrate 11.

A diffusion layer (P-type diffusion separating wall) 13 constructed by P-type is formed in the substrate 11 so as to separate the Hall element 10 from other elements. In an area (active area) surrounded by this diffusion layer 13 on the surface of the semiconductor area 12, contact areas ($N^+$ diffusion layer) 14a to 14f are formed in a shape for selectively raising impurity concentration (N-type) of the same surface. Thus, preferable ohmic contact is formed between these respective contact areas 14a to 14f and electrodes 15a to 15f arranged in these contact areas 14a to 14f.

Two electrodes 15a, 15c formed along line IB-IB among six electrodes 15a to 15f correspond to a first electrode group, and are a first electrode pair. One electrode 15a constituting the first electrode pair is arranged between two electrodes 15e, 15f. The other electrode 15c is arranged between two electrodes 15b, 15d. Namely, electrodes 15b, 15d to 15f correspond to a second electrode group. In the electrode pair constructed by electrodes 15b, 15d and the electrode pair constructed by electrodes 15e, 15f, electrodes 15b and 15f and electrodes 15d and 15e having a relation for nipping a straight line (line IB-IB) formed by two electrodes 15a, 15c constituting the first electrode pair are respectively electrically connected by wirings 16a, 16b arranged on the substrate 11.

In this embodiment mode, in electrodes 15b, 15d to 15f constituting the second electrode group, electrodes 15e and 15f and electrodes 15b and 15d constituting electrode pairs are respectively arranged so as to have the relation of line symmetry with respect to the straight line (line IB-IB) formed by two electrodes 15a, 15c constituting the first electrode pair. Further, wirings 16a, 16b are set such that wiring resistances are approximately equal to each other. In this embodiment mode, the wirings are constructed by the same material (e.g., aluminum), and are set such that sections and wiring lengths mutually become approximately equal.

As shown in FIG. 1A, an area (active area) surrounded by the diffusion layer 13 is divided into areas 12a, 12b separated by a diffusion layer (P-type diffusion separating wall) 13a of P-type through PN junction separation using each diffusion layer. Here, the diffusion layer 13a corresponds to an electric potential barrier, and has a diffusion depth shallower than that of the semiconductor area 12, and forms an electric current path by selectively narrowing the vicinity of a bottom face of the semiconductor area 12. Further, as shown in FIG. 1B, an electrically partitioned area is also formed within the substrate in areas 12a, 12b. The area electrically partitioned within the substrate in these areas 12a, 12b becomes a so-called magnetic detecting portion (Hall plate) HP. In areas 12a, 12b, contact areas 14a, 14e, 14f (electrodes 15a, 15e, 15f) are formed in area 12a, and contact areas 14b to 14d (electrodes 15b to 15d) are formed in area 12b.

The Hall element 10 constructed in this way can be formed by a general CMOS process. Accordingly, integration (one-chip formation) with a peripheral circuit can be easily performed, and manufacture cost can be reduced in comparison with a bipolar process.

Next, the operation of the magnetic sensor 100 (Hall element 10) in accordance with this embodiment mode will be explained. Terminals V1, V2, V3 and V4 shown in FIGS. 1A and 1B are terminals respectively electrically connected to electrodes 15a, 15b, 15c and 15d. In these four terminals V1 to V4, terminals V1 and V3 constitute a pair, and terminals V2 and V4 constitute a pair.

For example, when a voltage is applied between terminals V1 and V3 constituting a pair and a constant driving electric current is supplied from electrode 15a to the semiconductor area 12, the driving electric current is flowed from the contact area 14a to the contact area 14c through the magnetic detecting portion HP and a downward portion of the diffusion layer 13a. Namely, in this case, the electric current including a component perpendicular to the substrate surface is flowed to the magnetic detecting portion HP. Therefore, when a magnetic field (e.g., the magnetic field shown by arrow B within FIG. 1A) including a component parallel to the substrate surface is applied to the magnetic detecting portion HP of the Hall element 10 in a flowing state of this driving electric current, a Hall voltage $V_H$ corresponding to this magnetic field is generated between terminals V2 and V4 constituting a pair by the Hall effect. Accordingly, a magnetic field component as a detecting object, i.e., a magnetic field component parallel to the surface of the substrate used in the Hall element 10 is calculated by detecting this Hall voltage $V_H$ signal generated through these terminals V2 and V4. Further, a flowing direction of the driving electric current in this Hall element 10 is arbitrary, and the magnetic field (magnetism) can be also detected by oppositely setting the direction of the above driving electric current. Further, the magnetic field (magnetism) can be also detected by reversely setting the terminal pair for flowing the driving electric current and the terminal pair for detecting the Hall voltage.

Figure 2A:
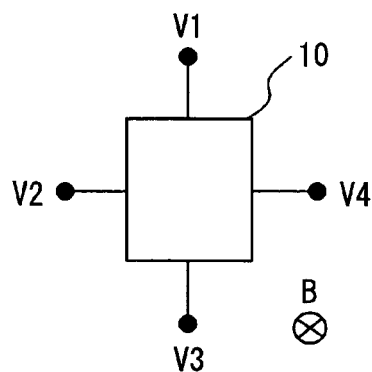
FIG. 2A is a schematic diagram showing a Hall element in the sensor.
Figure 2B:
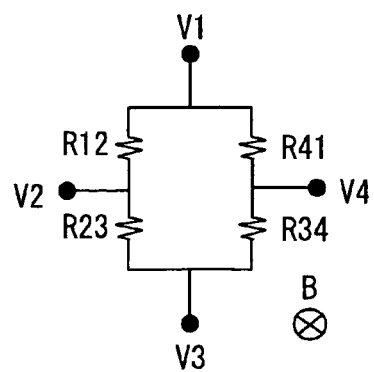
FIG. 2B is a circuit diagram showing an equivalent circuit of the Hall element.

Next, a driving mode of the magnetic sensor 100 (Hall element 10) in accordance with this embodiment mode will be explained by using FIGS. 2A and 2B. FIG. 2A is a plan view of the Hall element 10. FIG. 2B is an equivalent circuit of the Hall element 10.

As a result in which a carrier moving within a substance is unevenly distributed by receiving Rorentz force due to the magnetic field, the Hall voltage is generated by an electric field generated so as to balance with this Rorentz force. Accordingly, for example, when the magnetic field of a direction shown by arrow B is applied in a state in which a constant driving electric current is flowed to the Hall element 10 as shown in FIGS. 2A and 2B from terminal V1 to terminal V3, the electric potential of terminal V2 is raised by an amount of Hall voltage $V_H24$ with respect to the electric potential of terminal V4. Further, when the magnetic field of a direction shown by arrow B is applied in a state in which a constant driving electric current is flowed from terminal V2 to terminal V4, the electric potential of terminal V3 is raised by an amount of Hall voltage $V_H31$ with respect to the electric potential of terminal V1. At this time, if the Hall element 10 is made perfectly symmetrically between terminals V1 to V4, voltages V24 and V31 respectively outputted between terminals V2 and V4 and between terminals V1 and V3 respectively become "V24=$V_H$24" and "V31=$V_H$31".

However, there are a restriction relative to arrangement positions of electrodes 15a to 15f, a position shift (alignment shift) due to a mask alignment error at a device manufacturing time, etc. Therefore, it is very difficult to perfectly symmetrically make the Hall element 10 between terminals V1 to V4. Therefore, an offset voltage (unbalance voltage) is included in the actually outputted voltage together with the Hall voltage. Namely, output voltages V24 and V31 respectively become "V24=$V_H$24+$\Delta$V24", and "V31=$V_H$31+$\Delta$V31". When the offset voltage is included in the output voltage in this way, deterioration of temperature characteristics caused by the offset voltage, etc. are easily caused, there is a fear of a reduction of magnetic detecting accuracy. In this connection, the offset voltage said here also corresponds to the output voltage provided when no magnetic field is applied.

Here, when the Hall element 10 is considered as a resistance bridge as shown in FIG. 2B, offset voltage $\Delta$V24 at the flowing time of a constant driving electric current I13 from terminal V1 to terminal V3 becomes as follows.

$$\Delta V24 = I13 \times (R23 \times R41 - R12 \times R34)/(R12+R23+R34+R41).$$

Further, offset voltage $\Delta$V31 at the flowing time of a constant driving electric current I24 from terminal V2 to terminal V4 becomes as follows.

$$\Delta V31 = I24 \times (R12 \times R34 - R23 \times R41)/(R12+R23+R34+R14).$$

Namely, these offset voltages $\Delta$V24 and $\Delta$V31 have the relation of "$\Delta V24 \times I24 = -\Delta V31 \times I13$".

Further, in this embodiment mode, the magnetic field is detected while the terminal pair (electrode pair) for supplying the driving electric current and the terminal pair (electrode pair) for detecting the Hall voltage are replaced in a predetermined period. Namely, voltage detection using terminals V2 and V4 executed by flowing the driving electric current between terminals V1 and V3, and voltage detection using terminals V1 and V3 executed by flowing the driving electric current between terminals V2 and V4 are repeatedly performed in the predetermined period. Thus, the Hall element 10 is operated by a so-called spinning current method.

Further, in the Hall element 10, electrodes 15e, 15f constituting the second electrode group have the relation of line symmetry with respect to a straight line (line IB-IB) formed by electrodes 15a, 15c while one electrode 15a constituting the first electrode pair is nipped between electrodes 15e, 15f. Further, electrodes 15b, 15d constituting the second electrode group have the relation of line symmetry with respect to the straight line (line L1-L1) formed by electrodes 15a, 15c while one electrode 15c constituting the first electrode pair is nipped between electrodes 15b, 15d. Further, electrodes 15b and 15f and electrodes 15d and 15e having a relation for nipping the straight line (line IB-IB) formed by electrodes 15a, 15c are respectively electrically connected by wirings 16a, 16b arranged on the substrate 11 (see FIG. 1A). Accordingly, the Hall voltage can be also similarly detected when one of the terminal pair (the first electrode pair using electrodes 15a and 15c) of terminals V1 and V3 and the terminal pair (the second electrode pair of electrodes 15c and 15d) of terminals V2 and V4 is used as a terminal pair (electrode pair) for detecting the Hall voltage. Namely, voltages V24 and V31 respectively outputted between terminals V2 and V4 and between terminals V1 and V3 have the relation of "V24≈V31".

Further, at this time, the magnitude of the driving electric current supplied between terminals V1 and V3 and the magnitude of the driving electric current supplied between terminals V2 and V4 are set to be equal. Namely, "I13=I24" is attained. When the sum of V24 and V31 is here done, the offset voltage is perfectly canceled in principle as in V24+V31=$V_H$24+$V_H$31. Thus, magnetism (magnetic field) corresponding to the Hall voltage detected in the predetermined period is calculated from this Hall voltage so that the offset voltage is restrained. For example, it is possible to relax an influence of a resistance amount change due to lattice defect growth, etc., an influence of a temperature change of resistance, etc. Thus, the magnetic field can be detected with higher precision.

Thus, in the magnetic sensor 100 in accordance with this embodiment mode, magnetism (magnetic field) can be detected while the offset voltage is canceled through the above structure and driving method.

Figures 3, 11:
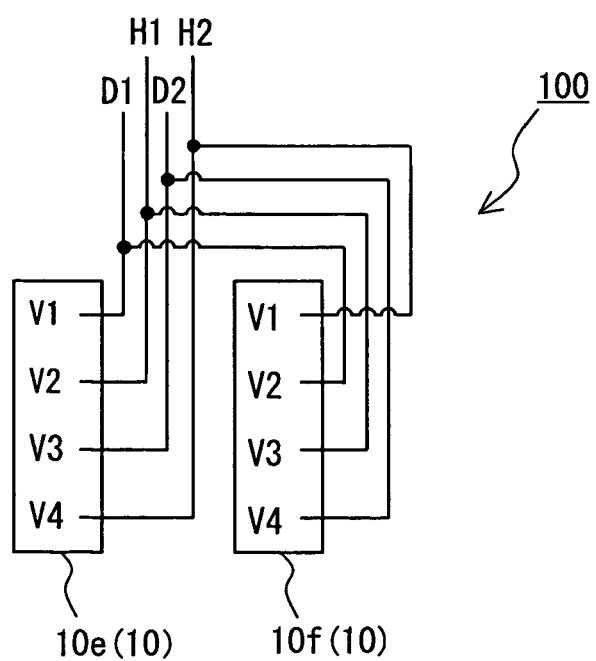
FIG. 3 is a table explaining a spinning current method.
FIG. 11 is a schematic diagram showing connections in the sensor according to a modification of the sixth embodiment mode.

In the explanation of the driving mode, this embodiment mode shows an example in which the voltage detection using terminals V2 and V4 executed by flowing the driving electric current from terminal V1 to terminal V3, and the voltage detection using terminals V3 and V1 executed by flowing the driving electric current from terminal V2 to terminal V4 are repeatedly performed in the predetermined period, and the offset voltage is reduced (canceled). However, the magnetic sensor 100 in accordance with this embodiment mode is also constructed so as to perform voltage detection using terminals V4 and V2 executed by flowing the driving electric current from terminal V3 to terminal V1, and voltage detection using terminals V1 and V3 executed by flowing the driving electric current from terminal V4 to terminal V2. Magnetism (magnetic field) can be also detected by these two combinations while the offset voltage is canceled. Namely, if it is a driving mode able to detect magnetism (magnetic field) by switching the terminal pair (electrode pair) for the driving electric current and the flowing direction of the driving electric current (by performing the spinning current) while the offset voltage is reduced (canceled), this driving mode can be adopted. For example, as shown in FIG. 3, the offset voltage may be also reduced (canceled) while the driving electric current is flowed in four combinations and the Hall voltage is averaged. FIG. 3 is a view showing an example of the spinning current method.

Further, this embodiment mode shows an example in which the diffusion layer 13 is arranged so as to surround the semiconductor area 12. However, a structure having only the diffusion layer 13a in the diffusion layer 13 may be also set.

Figure 4A:
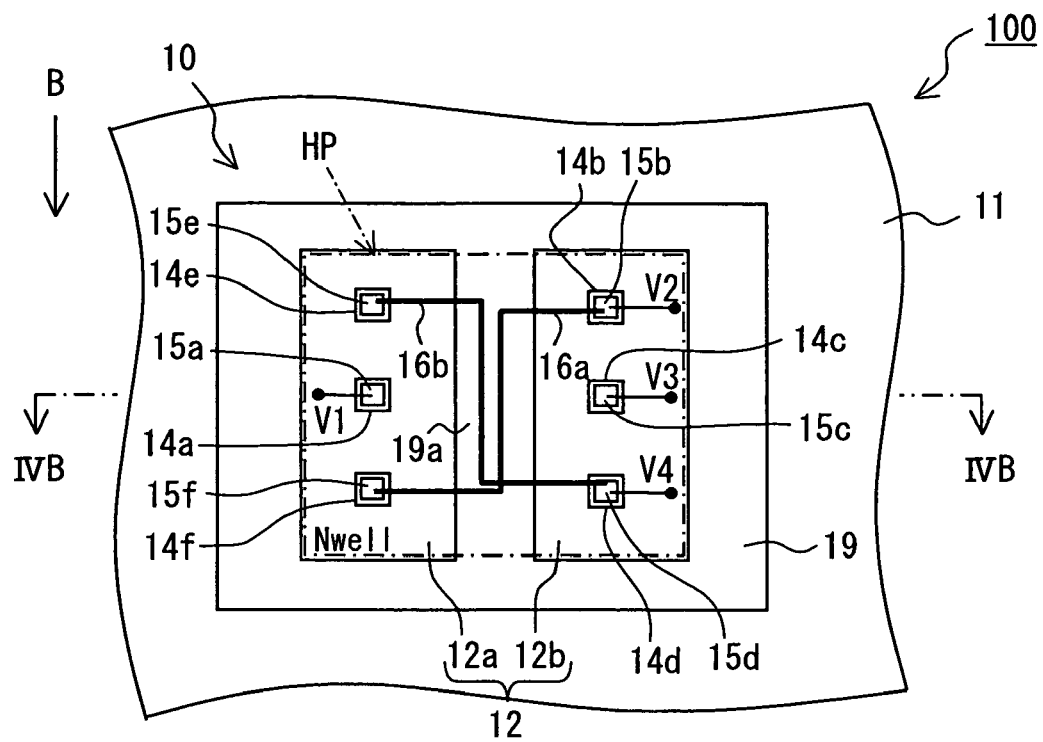
FIG. 4A a plan view showing a magnetic sensor according to a modification of the first embodiment mode.
Figure 4B:
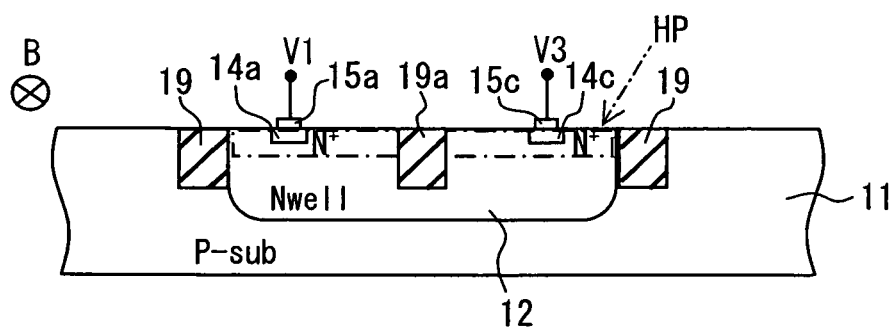
FIG. 4B is a cross sectional view showing the sensor taken along line IVB-IVB in FIG. 4A.

Further, this embodiment mode shows an example in which the diffusion layer 13a of P-type is adopted as an electric potential barrier, and the diffusion layer 13 of P-type surrounds the semiconductor area 12. However, as shown in FIGS. 4A and 4B, trenches 19, 19a (corresponding to a trench separating area) burying an insulating film may be also adopted instead of diffusion layers 13, 13a. A trench of a high aspect ratio may be used and a shallow trench of a shallow groove may be also used as trenches 19, 19a. In such a construction, magnetism can be also detected similarly to a case using the diffusion layer 13a as an electric potential barrier. FIGS. 4A and 4B are views showing a modified example in which FIG. 4A is a plan view and FIG. 4B is a cross-sectional view along line IVB-IVB of FIG. 4A.

Second Embodiment Mode

Figure 5A:
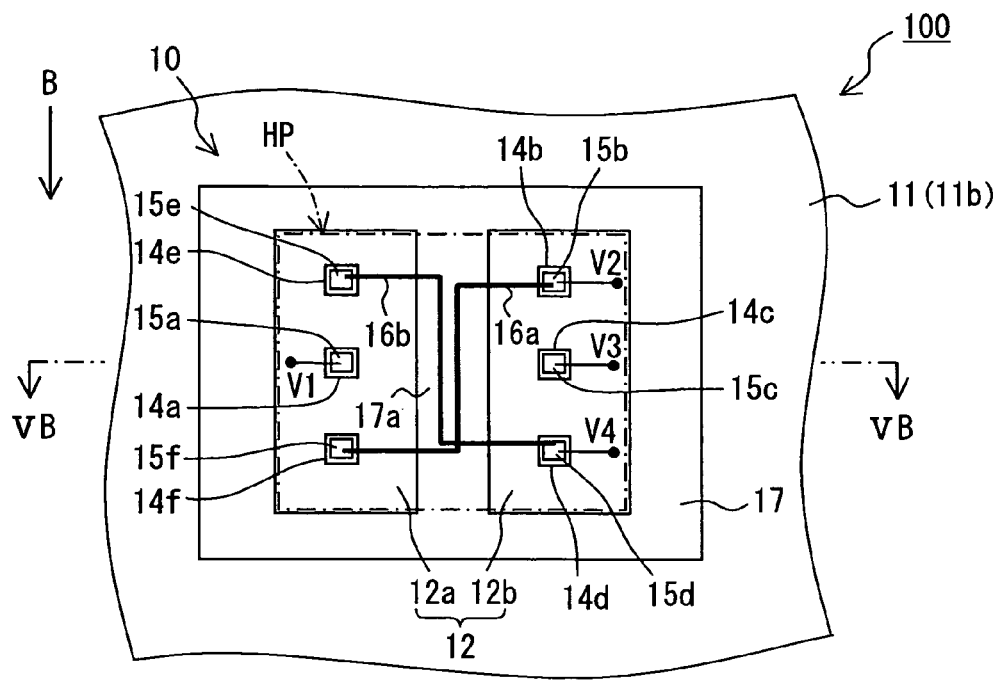
FIG. 5A is a plan view showing a magnetic sensor according to a second embodiment mode.
Figure 5B:
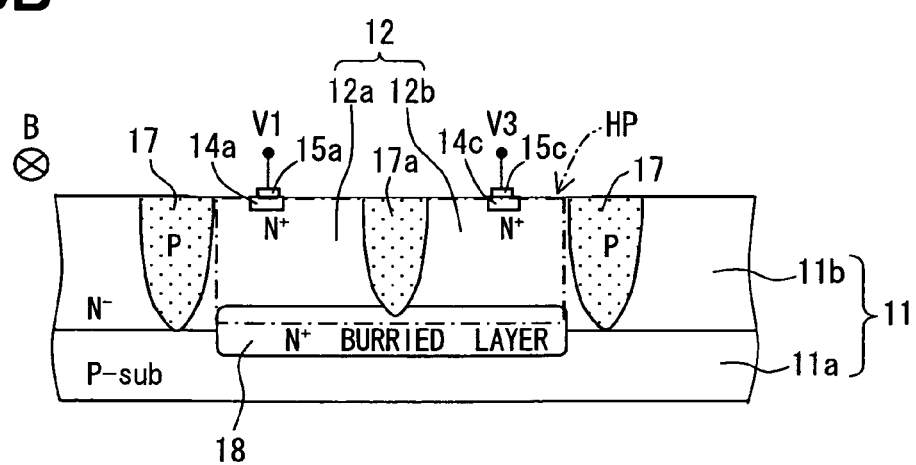
FIG. 5B is a cross sectional view showing the sensor taken along line VB-VB in FIG. 5A.

A second embodiment mode will next be explained on the basis of FIGS. 5A and 5B. FIGS. 5A and 5B are views showing the schematic construction of a magnetic sensor in accordance with the second embodiment mode, where FIG. 5A is a plan view and FIG. 5B is a cross-sectional view along line VB-VB of FIG. 5A.

The magnetic sensor in accordance with the second embodiment mode is common to the magnetic sensor 100 shown in the first embodiment mode in many portions.

In the magnetic sensor 100 in accordance with this embodiment mode, the Hall element 10 of the vertical type is formed by utilizing a bipolar process. The operation and driving mode of the magnetic sensor 100 are similar to those of the first embodiment mode.

As shown in FIGS. 5A, 5B, the substrate 11 is constructed by a semiconductor substrate 11a constructed by e.g., silicon of P-type (first electric conductivity type) and a semiconductor layer 11b constructed by silicon of N-type (second electric conductivity type) formed by e.g., epitaxial growth on the semiconductor substrate 11a. Silicon of N-type is generally greater in carrier mobility than silicon of P-type. Therefore, silicon of N-type is particularly suitable as a material of the semiconductor layer 11b.

Similar to the first embodiment mode, six electrodes 15a to 15f are formed on the semiconductor layer 11b. One electrode 15a constituting the first electrode pair (first electrode group) formed along line VB-VB is arranged between electrodes 15e, 15f constituting one electrode pair of the second electrode group. The other electrode 15c is arranged between electrodes 15b, 15d constituting the other electrode pair of the second electrode group. In the electrode pair constructed by electrodes 15b, 15d and the electrode pair constructed by electrodes 15e, 15f, electrodes 15b and 15f and electrodes 15d and 15e having a relation for nipping a straight line (line VB-VB) formed by two electrodes 15a, 15c constituting the first electrode pair are respectively electrically connected by wirings 16a, 16b arranged on the substrate 11.

In this embodiment mode, in electrodes 15b, 15d to 15f constituting the second electrode group, electrodes 15b and 15*f* and electrodes 15*d* and 15*e* constituting the respective electrode pairs respectively have the relation of line symmetry with respect to the straight line (line VB-VB) formed by two electrodes 15*a*, 15*c* constituting the first electrode pair. Further, wirings 16*a*, 16*b* are set such that wiring resistances mutually become approximately equal.

Further, a diffusion area 17 of P-type (first electric conductivity type) is formed in the semiconductor layer 11*b* in a shape surrounding the circumference of all the electrodes 15*a* to 15*f*. Further, a diffusion area 17*a* of P-type (first electric conductivity type) connected to the diffusion area 17 is formed inside the diffusion area 17 in a shape respectively partitioning portions between electrodes 15*a*, 15*e*, 15*f* and electrodes 15*b* to 15*d*. This diffusion area 17 is a first electric potential barrier, and the diffusion area 17*a* corresponds to a second electric potential barrier. The diffusion area 17*a* is formed on a bottom face of the semiconductor layer 11*b*, and is extended in a mode connected to a burying layer 18 constructed by N-type (second electric conductivity type) of concentration higher than that of the semiconductor layer 11*b*. Each diffusion area 17 is extended in a mode connected to the semiconductor substrate 11*a*.

A portion partitioned by these diffusion areas 17, 17*a*, semiconductor substrate 11*a* and burying layer 18 is a semiconductor area 12 in the semiconductor layer 11*b*. The semiconductor area 12 is electrically partitioned into two areas 12*a*, 12*b* by the diffusion area 17*a*. Further, this semiconductor area 12 becomes a magnetic detecting portion HP. Contact areas 14*a* to 14*f* are formed on the surface of the semiconductor layer 11*b* so as to form ohmic contact with electrodes 15*a* to 15*f*.

For example, when a voltage is applied between terminal V1 and terminal V3 and a constant driving electric current is supplied from the electrode 15*a* to the semiconductor layer 11*b* in the Hall element 10 constructed in this way, this electric current flows through the area 12*a* toward the burying layer 18. This electric current reaches a downward portion of the electrode 15*c* through an electric current passage selectively formed in the vicinity of the bottom face of the semiconductor layer 11*b* by the diffusion area 17*a* as an electric potential barrier, i.e., through the burying layer 18. Thereafter, this electric current is flowed into the electrode 15*c* through the area 12*b*. At this time, the electric current including a component perpendicular to the substrate surface is flowed to the magnetic detecting portion HP. Therefore, when a magnetic field including a component horizontal with respect to the substrate surface is applied, a Hall voltage is generated by the Hall effect between electrodes 15*b* and 15*d*. Accordingly, the magnetic field component horizontal to the surface of the substrate 11 is calculated by detecting this generated Hall voltage signal through terminals V2 and V4. Further, a flowing direction of the driving electric current in this Hall element 10 is arbitrary, and the magnetic field (magnetism) can be also detected by oppositely setting the direction of the above driving electric current. Further, the magnetic field (magnetism) can be also detected by reversely setting the terminal pair for flowing the driving electric current and the terminal pair for detecting the Hall voltage. Further, the magnetic field (magnetism) can be similarly detected when the direction of the driving electric current is oppositely set, e.g., in a case flowing the driving electric current from the electrode 15*c* to the electrode 15*a*.

Thus, in the magnetic sensor 100 in accordance with this embodiment mode, similar to the first embodiment mode, six electrodes 15*a* to 15*f* are also formed, and effects similar to those of the first embodiment mode can be expected.

Further, in this embodiment mode, the Hall element 10 can be formed by using a general bipolar process. The bipolar process is generally a process suitable for the manufacture of an analog circuit normally used as a driving circuit of a sensor. Therefore, the Hall element 10 and a peripheral circuit can be easily integrated.

Further, this embodiment mode shows an example for adopting diffusion areas 17, 17*a* of P-type as first and second electric potential barriers. Thus, the Hall element 10 can be more easily manufactured, and cost of the magnetic sensor 100 can be reduced.

Figure 6A:
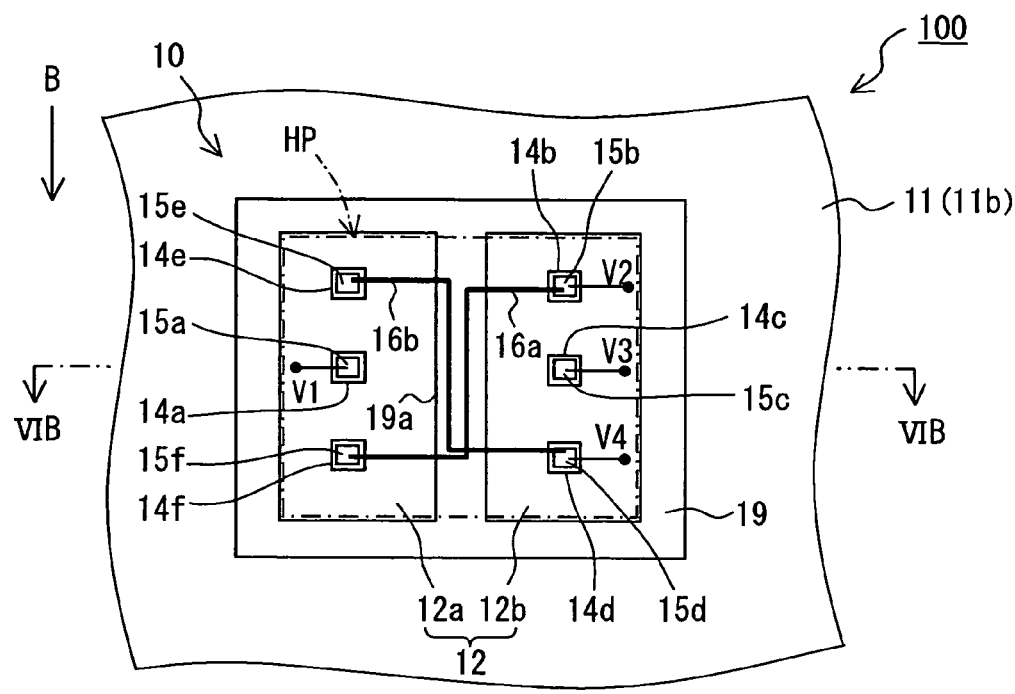
FIG. 6A a plan view showing a magnetic sensor according to a modification of the second embodiment mode.
Figure 6B:
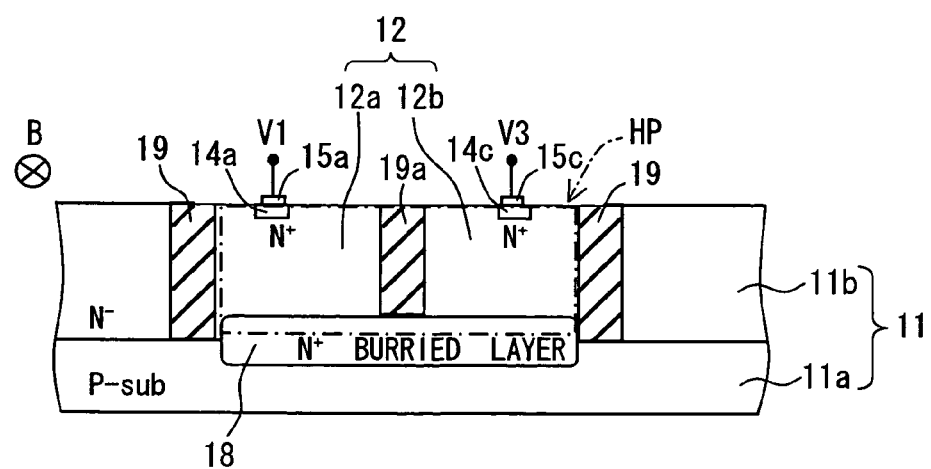
FIG. 6B is a cross sectional view showing the sensor taken along line VIB-VIB in FIG. 6A.

Further, this embodiment mode shows the example for adopting diffusion areas 17, 17*a* of P-type as the first and second electric potential barriers. However, as shown in FIGS. 6A and 6B, trenches 19, 19*a* burying an insulating film therein may be also adopted instead of diffusion areas 17, 17*a* of P-type. The trench 19*a* is arranged in a mode connected to the burying layer 18, and each trench 19 is extended in a mode connected to the semiconductor substrate 11*a*. Magnetism can be also detected by setting such a construction similarly to the case using diffusion areas 17, 17*a* of P-type as the first and second electric potential barriers. FIGS. 6A and 6B are views showing a modified example in which FIG. 6A is a plan view and FIG. 6B is a cross-sectional view along line VIB-VIB of FIG. 6A.

Third Embodiment Mode

Figure 7A:
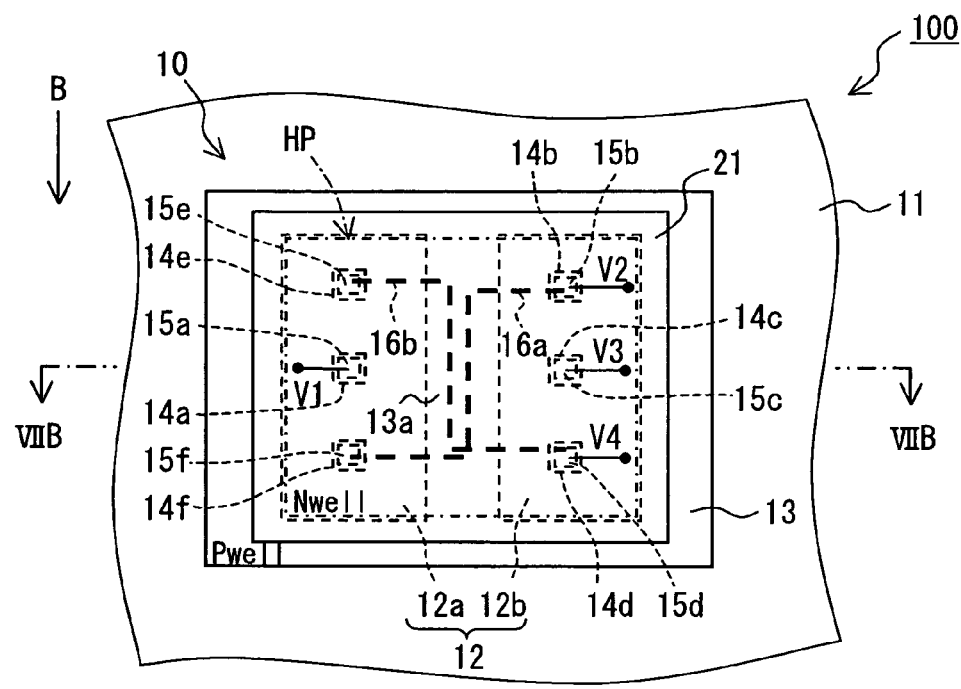
FIG. 7A is a plan view showing a magnetic sensor according to a third embodiment mode.
Figure 7B:
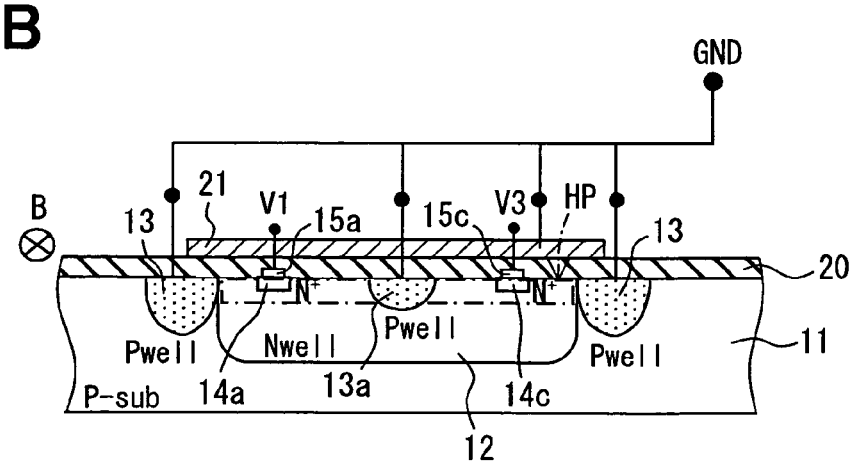
FIG. 7B is a cross sectional view showing the sensor taken along line VIIB-VIIB in FIG. 7A.

Next, a third embodiment mode will be explained on the basis of FIGS. 7A and 7B. FIGS. 7A and 7B are views showing the schematic construction of a magnetic sensor in accordance with the third embodiment mode, where FIG. 7A is a plan view and FIG. 7B is a cross-sectional view along line VIIB-VIIB of FIG. 7A.

The magnetic sensor in accordance with the third embodiment mode is common to the magnetic sensor 100 shown in the first and second embodiment modes in many portions.

As shown in FIGS. 7A and 7B, the magnetic sensor 100 in accordance with this embodiment mode basically approximately has the same structure as the magnetic sensor 100 shown in the first embodiment mode, and its operation mode is also set as mentioned above. In this embodiment mode, an electrode material 21 of a flat plate shape constructed by e.g., aluminum, polycrystal silicon, etc. is arranged on the substrate 11 through an insulating film 20 constructed by e.g., PSG, silicon oxide, etc. in a shape covering an element surface including the semiconductor area 12. Further, the electrode material 21 is fixed to a predetermined electric potential (e.g., a ground (GND) electric potential) through wiring together with diffusion layers 13, 13*a*.

A movable ion of sodium (Na), etc. exists in the interior of an interlayer insulating film (e.g., insulating film 20) formed on the element surface, etc. Therefore, this movable ion is moved in accordance with electric conduction to the Hall element 10, a temperature change, etc. Thus, there is a case in which the electric potential near a voltage output terminal on the substrate surface becomes unstable, and a very small Hall voltage signal outputted from the Hall element 10 is fluctuated. This fluctuation is called a change with the passage of time, or drift, and causes an error in detection of the magnetic field based on this voltage. When the magnetic sensor 100 is particularly used as an angle detecting sensor, deterioration of its sensor characteristics cannot be avoided and is serious.

In contrast to this, in the magnetic sensor 100 in accordance with this embodiment mode, the electrode material 21 is arranged and is fixed to a predetermined electric potential together with diffusion layers 13, 13*a*, and the electric potential of an element surface is fixed and its circumference is also placed in a stable electric potential environment. Thus, the movement of the movable ion is restrained, and a change with the passage of time, etc. caused by this movable ion become small, and detection accuracy as the magnetic sensor 100 is highly maintained. Further, since the electrode material 21 also functions as a shield with respect to noises from the upper direction of an element, noise resisting property of the Hall element 10 is also raised.

Thus, in accordance with the magnetic sensor 100 in this embodiment mode, an influence due to the movable ion, i.e., a reduction of detection accuracy can be suitably restrained in addition to the effects described in the first embodiment mode. Further, the noise resisting property of the Hall element 10 can be raised.

In this embodiment mode, the electrode material 21 is fixed to the ground electric potential, alternatively, the electrode material 21 may be also fixed to the electric potential of an electric power source.

Further, in this embodiment mode, diffusion layers 13, 13a are also fixed to a predetermined electric potential so as to firmly fix the electric potential, but this construction is no indispensable construction. If at least the electrode material 21 is fixed to a predetermined electric potential, effects similar to the above effects can be obtained.

Further, this embodiment mode shows an example for arranging the electrode material 21 with respect to the construction shown in the first embodiment mode. However, effects similar to the above effects can be also obtained by arranging the electrode material 21 with respect to the construction shown in the second embodiment mode.

Fourth Embodiment Mode

Figure 8A:
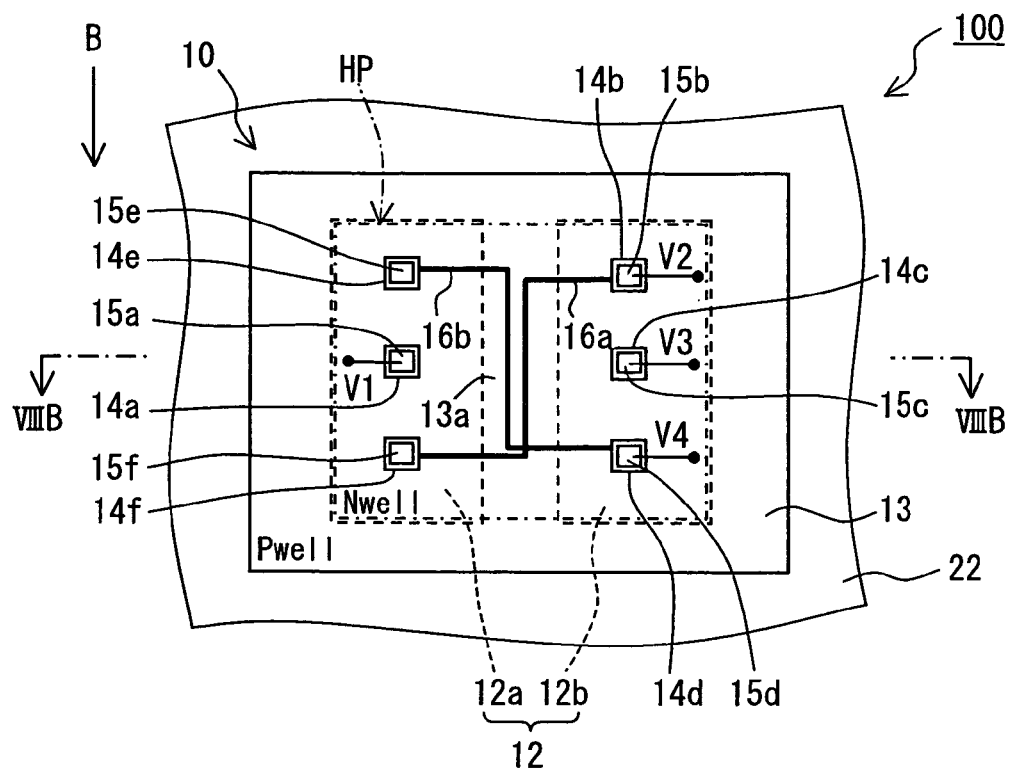
FIG. 8A is a plan view showing a magnetic sensor according to a fourth embodiment mode.
Figure 8B:
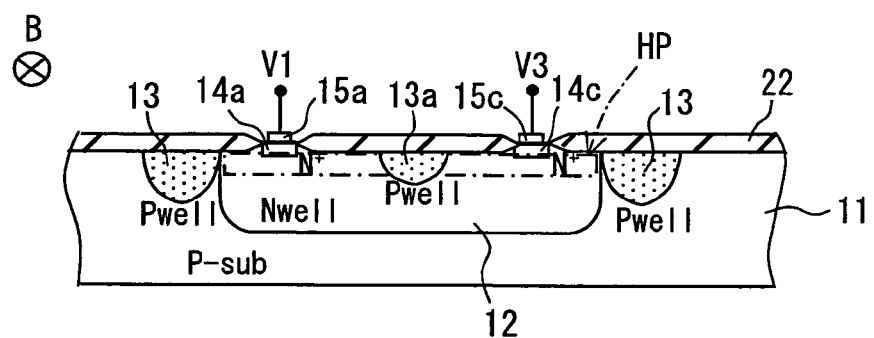
FIG. 8B is a cross sectional view showing the sensor taken along line VIIIB-VIIIB in FIG. 8A.

Next, a fourth embodiment mode will be explained on the basis of FIGS. 8A and 8B. FIGS. 8A and 8B are views showing the schematic construction of a magnetic sensor in accordance with the fourth embodiment mode, where FIG. 8A is a plan view and FIG. 8B is a cross-sectional view along line VIIIB-VIIIB of FIG. 8A.

The magnetic sensor in accordance with the fourth embodiment mode is common to the magnetic sensor 100 shown in each of the first to third embodiment modes in many portions.

As shown in FIGS. 8A, 8B, the magnetic sensor 100 in accordance with this embodiment mode basically approximately has the same structure as the magnetic sensor 100 shown in the first embodiment mode, and its operation mode is also set as mentioned above. In this embodiment mode, a LOCOS oxide film 22 is arranged on the substrate 11 in a shape approximately covering an entire face removing contact areas 14a to 14f of an element surface.

The behavior of a movable ion included in an interlayer insulating film, etc. formed on the element surface has an influence on the detection accuracy of the Hall element 10 as mentioned above. In contrast to this, in this embodiment mode, the element surface (semiconductor area 12, etc.) is covered with the LOCOS oxide film 22 so that this element surface is protected. Thus, an influence due to the movable ion, i.e., a reduction of the detection accuracy is restrained. Furthermore, this LOCOS oxide film 22 can be (simultaneously) formed together with a LOCOS oxide film used in element separation in a peripheral circuit of the magnetic sensor 100. After the Hall element is formed, the element surface is protected by LOCOS oxide film HL1 even when ion implantation processing, plasma processing, etc. are performed on the entire face of the substrate e.g., as a manufacturing process of this peripheral circuit. Thus, damage with respect to this Hall element due to these processings, etc. is reduced.

Thus, in accordance with the magnetic sensor 100 in this embodiment mode, the influence due to the movable ion, i.e., the reduction of detection accuracy can be suitably restrained in addition to the effects described in the first embodiment mode.

The LOCOS oxide film 22 can be formed simultaneously with the LOCOS oxide film used in the element separation in the peripheral circuit. Accordingly, the element surface is also protected by the LOCOS oxide film 22 even when the ion implantation processing, the plasma processing, etc. are performed on the entire face of the substrate as e.g., the manufacturing process of this peripheral circuit after the Hall element 10 is formed. Thus, damage with respect to the Hall element 10 due to these processings, etc. can be also reduced.

This embodiment mode shows an example for arranging the LOCOS oxide film 22 in a shape approximately covering the entire face removing contact areas 14a to 14f of the element surface. However, effects similar to the above effects can be obtained if the LOCOS oxide film 22 is arranged so as to cover at least the semiconductor area 12.

Further, this embodiment mode shows an example for arranging the LOCOS oxide film 22 with respect to the construction shown in the first embodiment mode. However, effects similar to the above effects can be also obtained by arranging the LOCOS oxide film 22 with respect to the constructions shown in the second and third embodiment modes.

Fifth Embodiment Mode

Figure 9A:
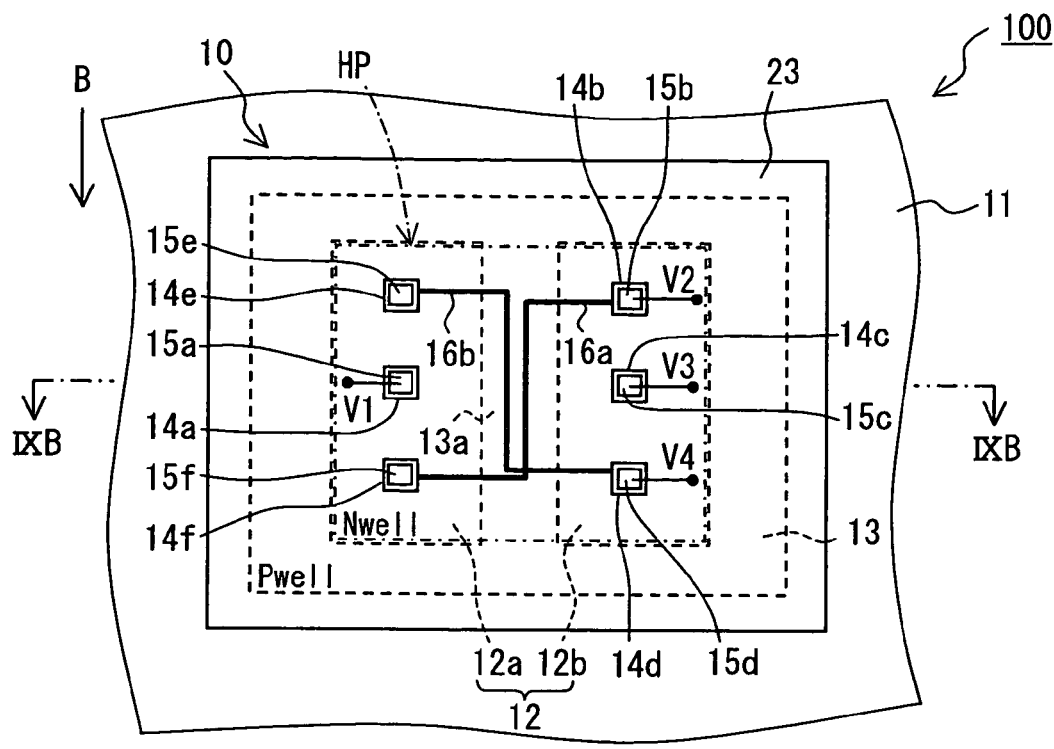
FIG. 9A is a plan view showing a magnetic sensor according to a fifth embodiment mode.
Figure 9B:
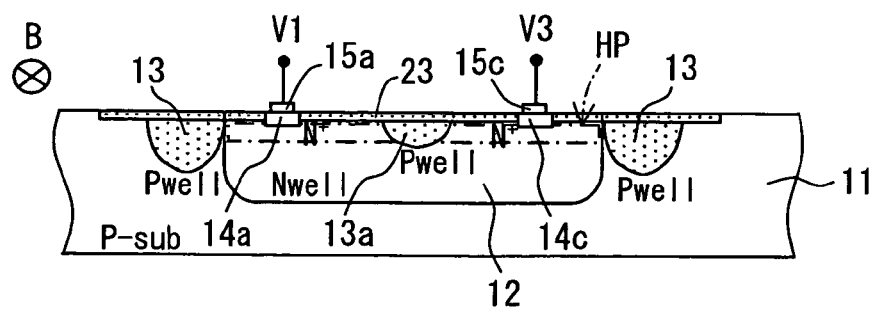
FIG. 9B is a cross sectional view showing the sensor taken along line IXB-IXB in FIG. 9A.

Next, a fifth embodiment mode will be explained on the basis of FIGS. 9A and 9B. FIGS. 9A and 9B are views showing the schematic construction of a magnetic sensor in accordance with the fifth embodiment, where FIG. 9A is a plan view and FIG. 9B is a cross-sectional view along line IXB-IXB of FIG. 9A.

The magnetic sensor in accordance with the fifth embodiment mode is common to the magnetic sensor 100 shown in each of the first to third embodiment modes in many portions.

As shown in FIGS. 9A and 9B, the magnetic sensor 100 in accordance with this embodiment mode basically approximately has the same structure as the magnetic sensor 100 shown in the first embodiment mode, and its operation mode is also set as mentioned above. In this embodiment mode, P-type impurities (e.g., boron) as an electric conductivity type different from that of the semiconductor area 12 are introduced into the substrate 11, and an impurity layer 23 of P-type is formed in a shape approximately covering an entire face removing contact areas 14a to 14f of an element surface.

As mentioned above, the behavior of a movable ion included in the interior of an interlayer insulating film of the element surface, etc. has an influence on the detection accuracy of the Hall element 10. In contrast to this, in accordance with the magnetic sensor 100 in this embodiment mode, for example, the Hall element 10 is placed in a state for applying the voltage of a reverse bias between the impurity layer 23 and the semiconductor area 12. Accordingly, the element surface is protected by a depletion layer near PN junction formed by the application of this voltage. Thus, an influence due to the movable ion, i.e., a reduction of the detection accuracy is restrained.

Thus, in accordance with the magnetic sensor 100 in this embodiment mode, the influence due to the movable ion, i.e., the reduction of the detection accuracy can be suitably restrained in addition to the effects described in the first embodiment mode.

This embodiment mode shows an example for arranging the impurity layer 23 in a shape approximately covering the entire face removing contact areas 14a to 14f of the element surface. However, effects similar to the above effects can be obtained if the impurity layer 23 is arranged so as to cover at least the semiconductor area 12.

Further, this embodiment mode shows an example for arranging the impurity layer 23 with respect to the construction shown in the first embodiment mode. However, effects similar to the above effects can be also obtained by arranging the impurity layer 23 with respect to the constructions shown in the second and third embodiment modes.

Sixth Embodiment Mode

Figure 10A:
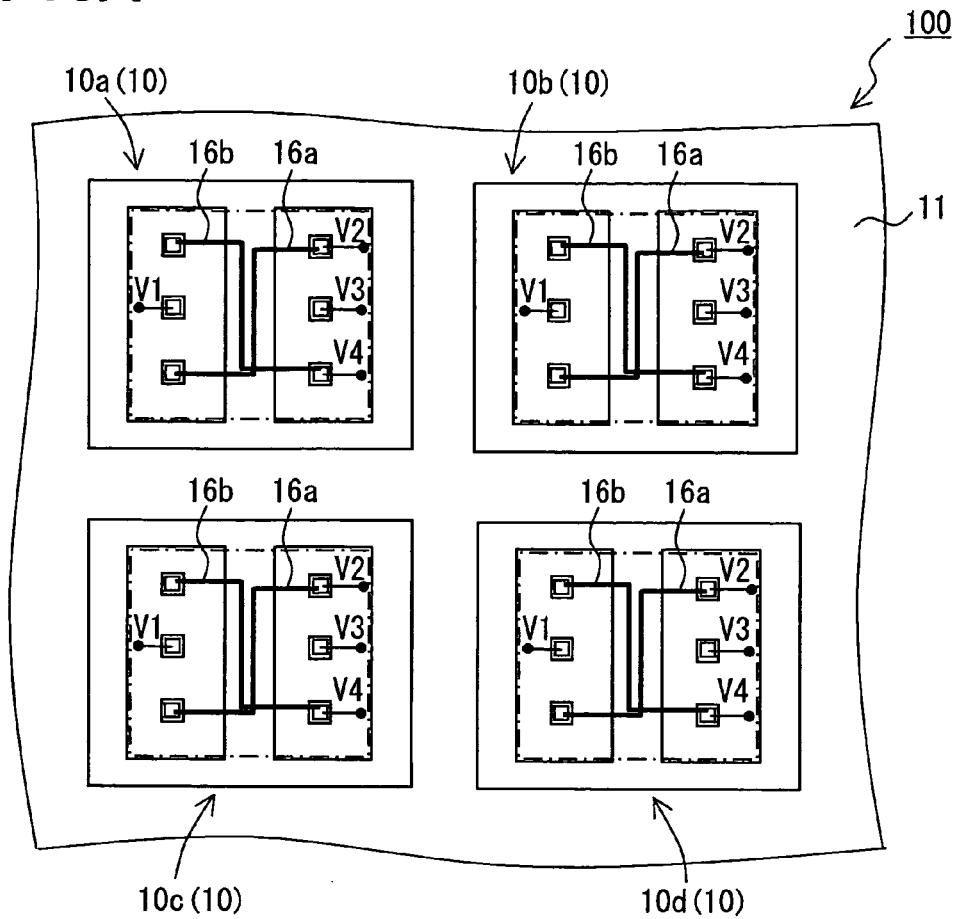
FIG. 10A is a plan view showing a magnetic sensor according to a sixth embodiment mode.
Figure 10B:
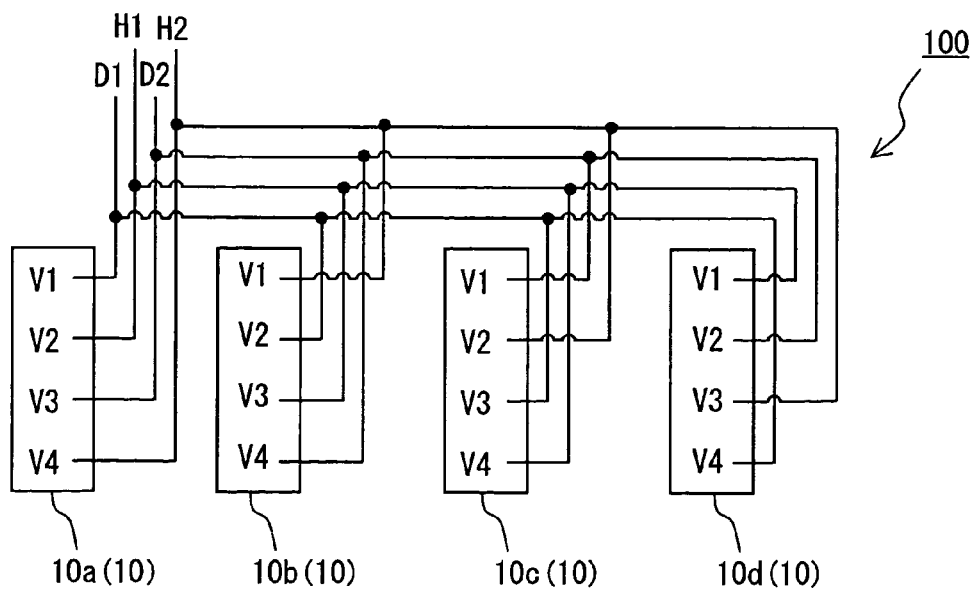
FIG. 10B is a schematic diagram showing connections in the sensor.

Next, a sixth embodiment mode will be explained on the basis of FIGS. 10A and 10B. FIGS. 10A and 10B are views showing the schematic construction of a magnetic sensor in accordance with the sixth embodiment mode, where FIG. 10A is a plan view and FIG. 10B is a typical view showing connection between respective elements. In FIG. 10B, only terminals V1 to V4 are illustrated by simplifying each Hall element 10.

The magnetic sensor in accordance with the sixth embodiment mode is common to the magnetic sensor 100 shown in each of the first to fifth embodiment modes in many portions.

As shown in FIGS. 10A and 10B, the magnetic sensor 100 in accordance with this embodiment mode is constructed by electrically connecting four Hall elements 10 (10a to 10d) in parallel so as to reduce an offset voltage, and integrating these Hall elements 10 in one chip. The structure of the magnetic sensor 100 in accordance with each of the above embodiment modes can be adopted as the Hall element 10. The four Hall elements 10 of the structure (see FIGS. 1A and 1B) shown in the first embodiment mode are adopted in this embodiment mode.

Concretely, in the four Hall elements 10a to 10d formed by the same arrangement on the same substrate 11, terminals of the side of a high electric potential among terminal pairs for supplying a driving electric current are electrically connected through wiring, and are collected in terminal D1. Terminals of the side of a low electric potential are electrically connected through wiring, and are collected in terminal D2. Further, terminals of the side of a high electric potential among terminal pairs for detecting the Hall voltage are electrically connected through wiring, and are collected in terminal H1. Terminals of the side of a low electric potential are electrically connected through wiring, and are collected in terminal H2. Namely, the magnetic sensor 100 in accordance with this embodiment mode is constructed such that the driving electric current is flowed from terminal D1 to terminal D2, and the Hall voltage generated by this driving electric current is detected by terminals H1, H2.

When mass production of the Hall element 10 is performed or many Hall elements 10 are formed on the same substrate 11, dispersion is generated in output voltage (Hall voltage) and offset voltage (unbalance voltage) between these elements by dispersion of these manufacturing conditions, etc. In contrast to this, in this embodiment mode, the magnetic sensor 100 is formed by connecting plural Hall elements 10 in parallel. Therefore, the output voltage (Hall voltage signal) as the entire sensor, and the offset voltage (unbalance voltage) are averaged and magnetic detection accuracy as the magnetic sensor 100 is highly maintained.

Further, in this embodiment mode, in Hall elements 10a to 10d, different terminals are respectively connected to terminal D1 of the side of the high electric potential and terminal D2 of the side of the low electric potential among the terminal pair for supplying the driving electric current, and are also respectively connected to terminal H1 of the side of the high electric potential and terminal H2 of the side of the low electric potential among the terminal pair for detecting the Hall voltage. Concretely, terminal V1 of Hall element 10a, terminal V2 of Hall element 10b, terminal V3 of Hall element 10c and terminal V4 of Hall element 10d are connected to terminal D1. Further, terminal V3 of Hall element 10a, terminal V4 of Hall element 10b, terminal V1 of Hall element 10c and terminal V2 of Hall element 10d are connected to terminal D2. Terminal V2 of Hall element 10a, terminal V3 of Hall element 10b, terminal V4 of Hall element 10c and terminal V1 of Hall element 10d are connected to terminal H1. Terminal V3 of Hall element 10a, terminal V1 of Hall element 10b, terminal V2 of Hall element 10c and terminal V3 of Hall element 10d are connected to terminal H2. Namely, in the four Hall elements 10a to 10d, flowing directions of the driving electric current are respectively different. In the set of Hall elements 10a and 10b, the offset voltages generated in the respective Hall elements are canceled. In the set of Hall elements 10c and 10d, the offset voltages generated in the respective Hall elements are canceled. Namely, effects similar to those of the spinning current method in one Hall element 10 shown in the first embodiment mode are obtained by plural Hall elements 10a to 10d.

Thus, in accordance with the magnetic sensor 100 in this embodiment mode, the output voltage as the entire sensor can be averaged by connecting the plural Hall elements 10a to 10d in parallel. Further, the offset voltage (unbalance voltage) can be reduced while this offset voltage (unbalance voltage) is averaged. Accordingly, the offset voltage can be further reduced in comparison with a case for reducing the offset voltage by performing the spinning current in one Hall element 10. Accordingly, magnetic detection accuracy as the magnetic sensor 100 is highly maintained.

This embodiment mode shows a case for reducing the offset voltage by the four Hall elements 10a to 10d while the offset voltage is averaged. However, the number of Hall elements 10 is not limited to four. The number of Hall elements 10 may be set to a number able to cancel the offset voltage. The number of Hall elements 10 is suitably set to an even number. As shown in FIG. 11, similar effects can be also expected by, e.g., two Hall elements 10e, 10f. In this case, a physical constitution can be made compact in comparison with a case for adopting four Hall elements 10. However, an averaging effect becomes large as the number of Hall elements 10 is increased. FIG. 11 is a typical view showing a modified example. A mode able to cancel the offset voltages using two Hall elements 10e, 10f is not limited to the example of FIG. 11.

Seventh Embodiment Mode

Figure 12:
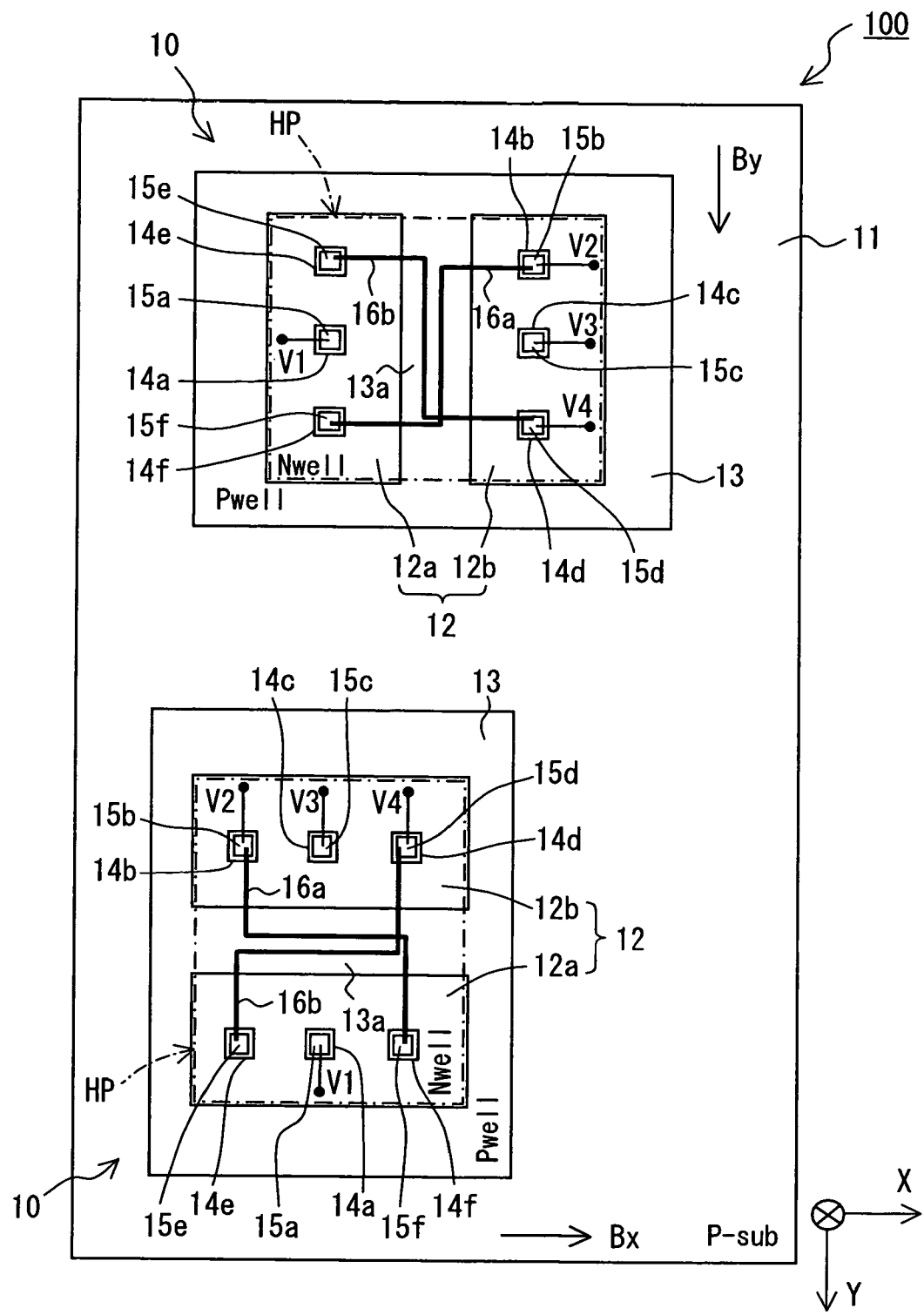
FIG. 12 is a plan view showing a magnetic sensor according to a seventh embodiment mode.

Next, a seventh embodiment mode will be explained on the basis of FIG. 12. FIG. 12 is a plan view showing the schematic construction of a magnetic sensor in accordance with the seventh embodiment mode.

The magnetic sensor in accordance with the seventh embodiment mode is common to the magnetic sensor 100 shown in each of the first to sixth embodiment modes in many portions.

As shown in FIG. 12, in this embodiment mode, Hall element 10 arranged in a mode for detecting magnetic fields (magnetic fields shown by arrows Bx and By within FIG. 12 applied from biaxial directions perpendicular to each other, i.e., at least two Hall elements 10 arranged in shapes perpendicular to each other are integrated in one chip so that the magnetic sensor 100 is constructed. In this embodiment mode, the Hall element 10 of the structure (see FIGS. 1A and 1B) shown in the first embodiment mode is adopted as the Hall element 10.

In the magnetic sensor 100 constructed in this way, for example, suitable processing (arithmetic processing) is performed with respect to Hall voltage signals from the two Hall elements 10 orthogonally arranged through a peripheral circuit arranged in the substrate 11, a signal processing circuit arranged separately from the substrate 11, etc. Thus, the magnetic field can be detected from all directions on one plane, i.e., at a wide angle of 360°.

In the two Hall elements 10 integrated in one chip in this way, there is a fear that a pair property of these elements is deteriorated by dispersion, etc. of various kinds of conditions in their manufacturing process. Therefore, it is desirable to approach their mutual distance as much as possible, and arrange the two Hall elements 10 within an interval of e.g., "100 μm". The dispersion between both the Hall elements caused by the manufacturing process, etc. is restrained by setting such an arrangement, and a more preferable pair property is obtained. Further, the dispersion between both the Hall elements is also restrained with respect to a condition of a using time such as a temperature environment, and a preferable pair property is also obtained in this meaning.

Thus, in accordance with the magnetic sensor 100 in this embodiment mode, the magnetic field can be detected at a wide angle of 360° in addition to the effects described in the first embodiment mode. Namely, two-dimensional detection can be performed.

In this embodiment mode, the magnetic sensor 100 is constructed by integrating the two Hall elements 10 in one chip in a mode for detecting the magnetic field applied from the biaxial directions perpendicular to each other. Alternatively, for example, effects corresponding to the above effects can be also obtained by two Hall elements 10 arranged in a mode for mutually crossing these Hall elements 10 at an acute angle.

Further, this embodiment mode shows an example for adopting the construction shown in the first embodiment mode as the Hall element 10. However, the constructions shown in the second to fifth embodiment modes can be also adopted. Further, the number of sets of Hall elements 10 orthogonally arranged can be set to be plural, and the construction shown in the sixth embodiment mode can be also combined.

Eighth Embodiment Mode

Figure 13:
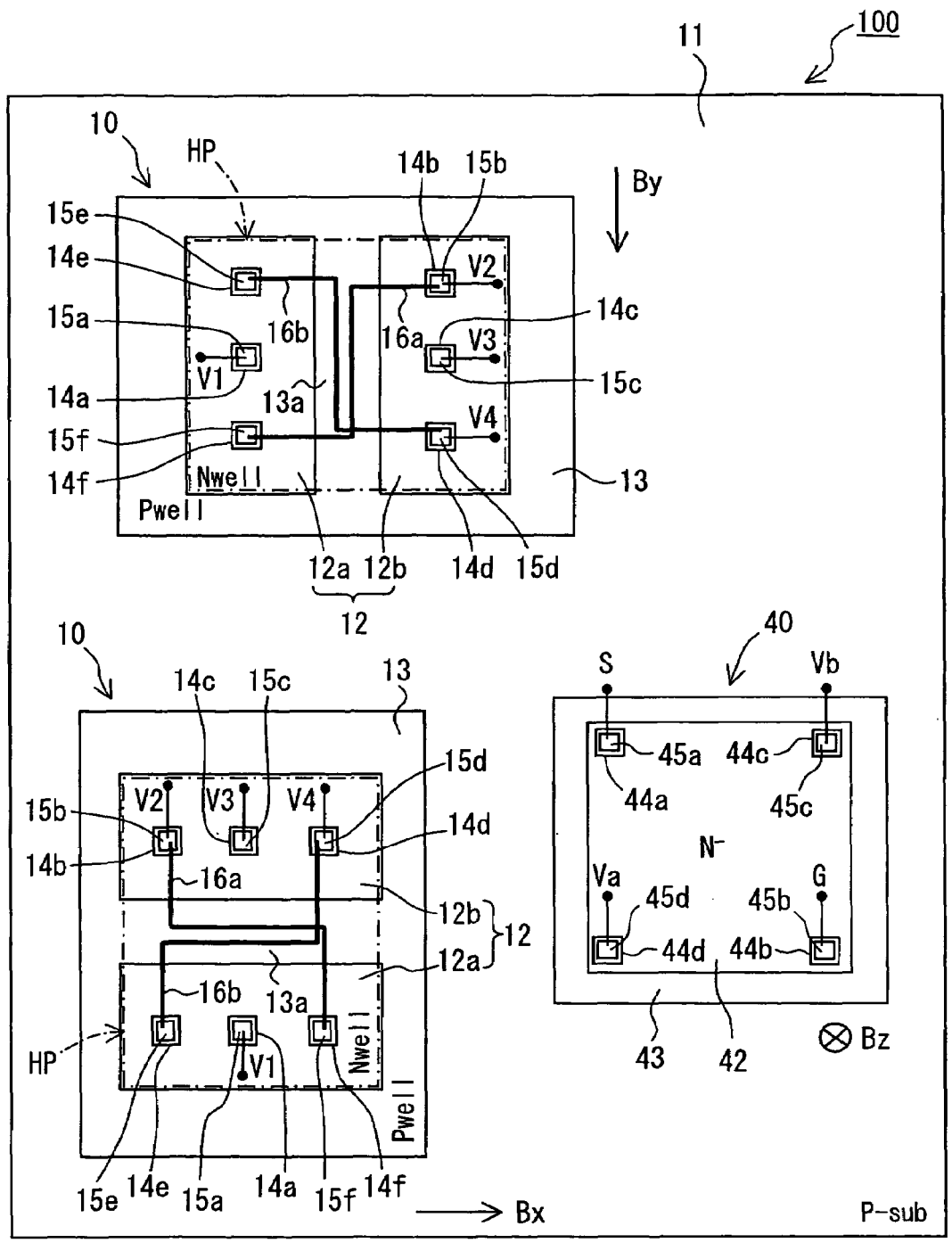
FIG. 13 is a plan view showing a magnetic sensor according to an eighth embodiment mode.

Next, an eighth embodiment mode will be explained on the basis of FIG. 13. FIG. 13 is a plan view showing the schematic construction of a magnetic sensor in accordance with the eighth embodiment mode.

The magnetic sensor in accordance with the eighth embodiment mode is common to the magnetic sensor 100 shown in the seventh embodiment mode in many portions. Accordingly, in the following description, detailed explanations of the common portions are omitted and different portions will be preponderantly explained.

Figure 27A:
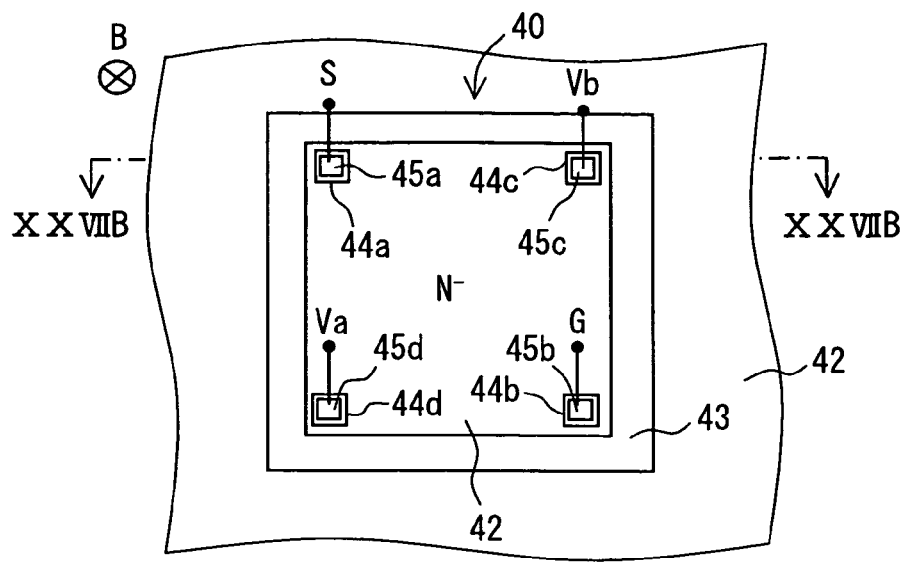
FIG. 27A is a plan view showing a lateral type magnetic sensor according to a prior art.
Figure 27B:
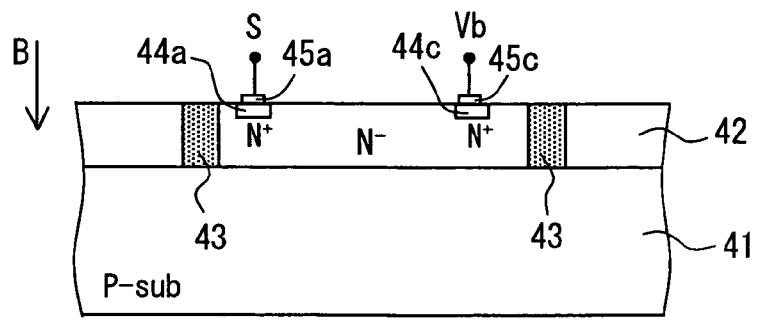
FIG. 27B is a cross sectional view showing the sensor taken along line XXVIIB-XXVIIB in FIG. 27A.
Figure 27C:
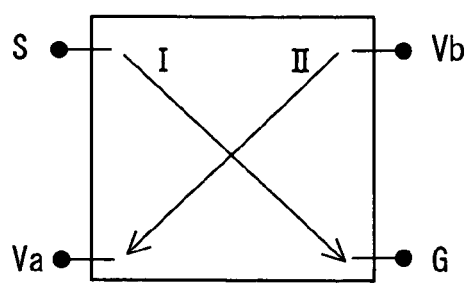
FIG. 27C is a schematic diagram explaining a spinning current method.

As shown in FIG. 13, in this embodiment mode, two Hall elements 10 of the vertical type orthogonally arranged are integrated in one chip together with a Hall element 40 of the lateral type for detecting a magnetic field component perpendicular to the substrate surface. Thus, a three-dimensional magnetic sensor 100 for detecting magnetic fields (magnetic fields shown by Bx, By, Bz within FIG. 13) from three-axis directions perpendicular to each other is constructed. In this embodiment mode, the Hall element 10 of the structure (see FIGS. 1A and 1B) shown in the first embodiment mode is adopted as the Hall element 10. Further, the Hall element 40 of the lateral type also basically has the structure illustrated in the previous FIGS. 27A to 27C. However, the semiconductor layer 42 is here formed as a diffusion layer (well) instead of the epitaxial film.

In the magnetic sensor 100 constructed in this way, for example, suitable processing (arithmetic processing) is performed with respect to a Hall voltage signal from each of the Hall elements 10, 40 through a peripheral circuit arranged in the substrate 11, a signal processing circuit arranged separately from the substrate 11, etc. Thus, in addition to all directions (two-dimensional directions) on one plane, the magnetic field can be also detected from an axial direction perpendicular to these directions. Namely, three-dimensional magnetic field detection is realized.

Thus, in accordance with the magnetic sensor 100 in this embodiment mode, the magnetic field can be detected from the three-axis directions perpendicular to each other in addition to the effects described in the first embodiment mode.

The Hall element 40 of the lateral type may detect a magnetic field component perpendicular to the substrate surface. Accordingly, the Hall element 40 of the structure shown in FIGS. 27A to 27C and a Hall element of a construction except for this Hall element 40 can be also adopted.

Further, this embodiment mode shows an example for adopting the construction shown in the first embodiment mode as the Hall element 10. However, the constructions shown in the second to fifth embodiment modes can be also adopted. Further, the number of sets of Hall elements 10 of the vertical type orthogonally arranged can be set to be plural, and the construction shown in the sixth embodiment mode can be also combined. Further, the number of Hall elements 40 of the lateral type can be set to be plural, and parallel formation and the spinning current method can be also simultaneously realized similarly to the sixth embodiment mode.

Ninth Embodiment Mode

Figure 14:
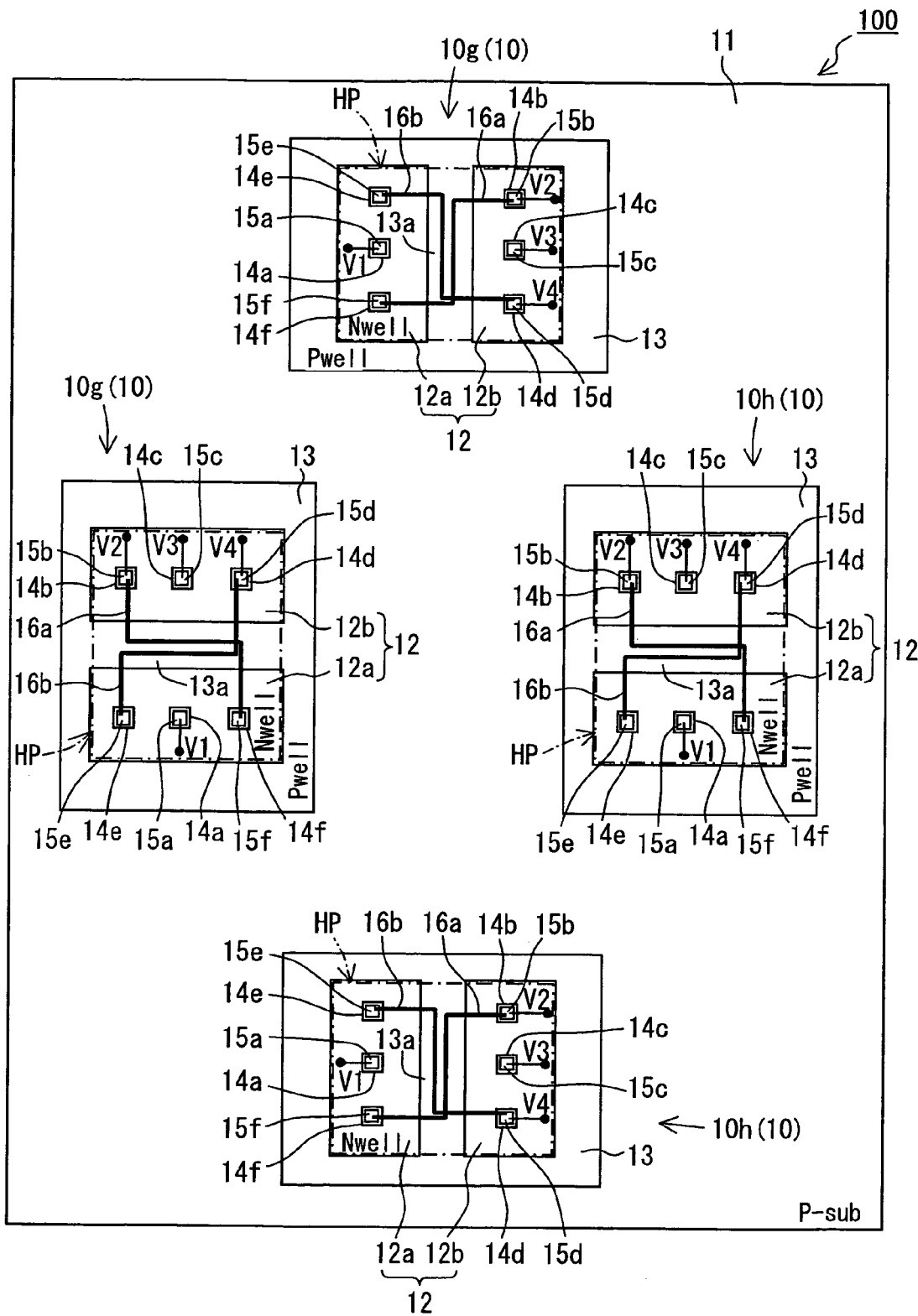
FIG. 14 is a plan view showing a magnetic sensor according to a ninth embodiment mode.

Next, a ninth embodiment mode will be explained on the basis of FIG. 14. FIG. 14 is a plan view showing the schematic construction of a magnetic sensor in accordance with the ninth embodiment mode.

The magnetic sensor in accordance with the ninth embodiment mode is common to the magnetic sensor 100 shown in each of the first to eighth embodiment modes in many portions.

As shown in FIG. 14, in this embodiment mode, a Hall element 10 arranged in a mode for detecting the magnetic field applied from biaxial directions perpendicular to each other, i.e., two Hall elements 10 arranged in shapes perpendicular to each other are also integrated in one chip so that the magnetic sensor is constructed. However, in this embodiment mode, two Hall elements 10g are respectively set to form a pair with respect to two Hall elements 10h arranged in a shape opposed in the same direction. In accordance with such a construction, the output voltages (Hall voltages) of the two Hall elements 10 mutually oppositely arranged and constituting a pair are averaged, and the outputs of these Hall elements 10 are switched, etc. so that detection accuracy as the magnetic sensor 100 can be raised. In this embodiment mode, the Hall element 10 of the structure (see FIGS. 1A and 1B) shown in the first embodiment mode is adopted as all the Hall elements 10.

Thus, in accordance with the magnetic sensor 100 in this embodiment mode, detection accuracy as the magnetic sensor can be raised in addition to the effects described in the first embodiment mode.

Figure 15:
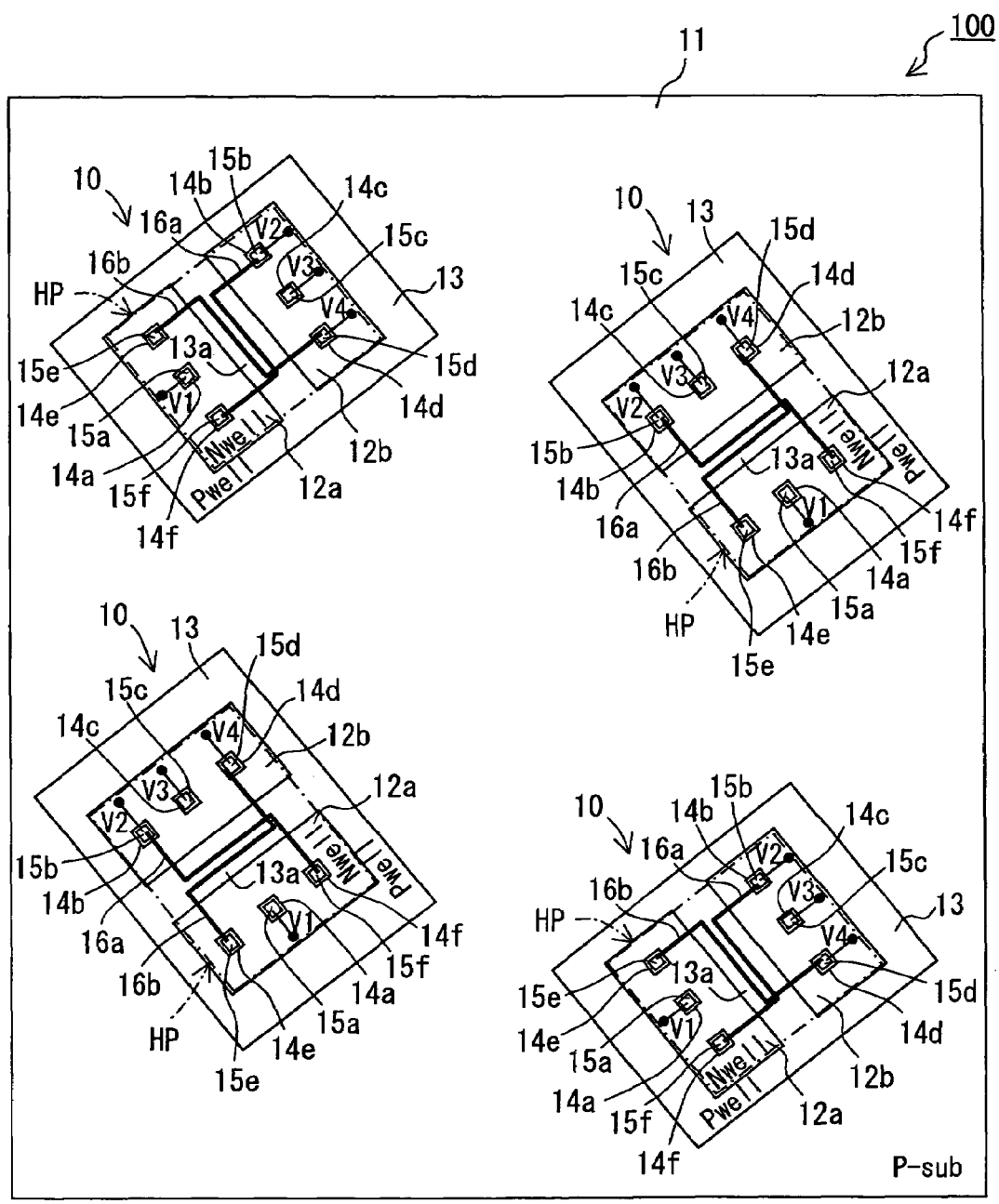
FIG. 15 is a plan view showing a magnetic sensor according to a modification of the ninth embodiment mode.

This embodiment mode shows an example in which both the pairs respectively formed by the two Hall elements 10 are arranged so as to become 0° or 90° with respect to a side face of the substrate 11 cut out as a chip. However, as shown in FIG. 15, both the pair of the Hall element 10g and the pair of the Hall element 10h may be also arranged so as to be inclined by 450 with respect to the side face of the substrate 11 cut out as a chip. Thus, no influence of various kinds of mechanical stresses applied from the exterior of an element is easily exerted. Namely, the offset voltage of each of these Hall elements 10g, 10h is suitably reduced, and detection accuracy as the magnetic sensor 100 can be further raised. FIG. 15 is a plan view showing a modified example.

Further, this embodiment mode shows an example for adopting the construction shown in the first embodiment mode as the Hall element 10 (10g, 10h). However, the constructions shown in the second to fifth embodiment modes can be also adopted. Further, the construction shown in the sixth embodiment mode can be also combined.

Tenth Embodiment Mode

Figure 16A:
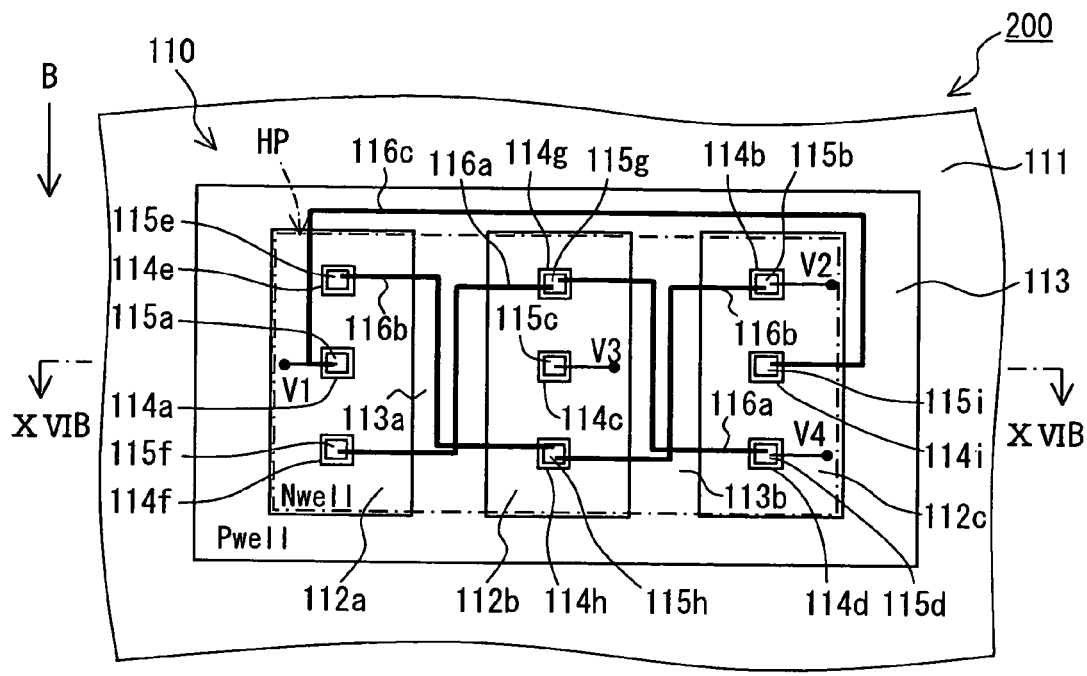
FIG. 16A is a plan view showing a magnetic sensor according to a tenth embodiment mode.
Figure 16B:
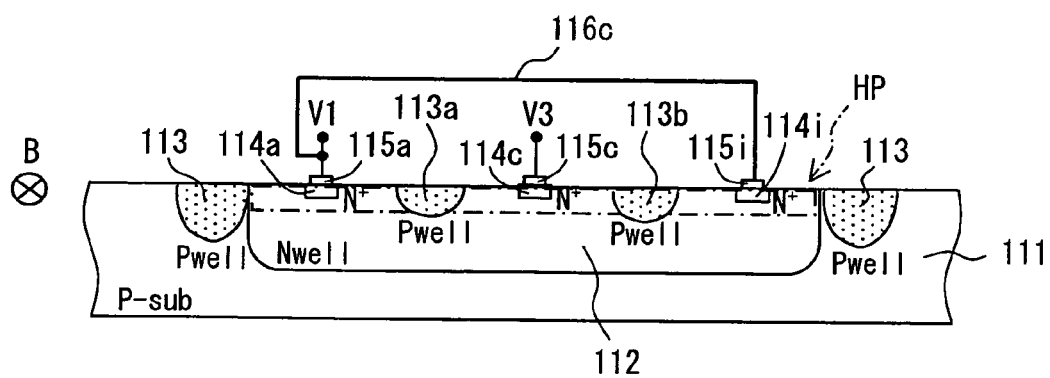
FIG. 16B is a cross sectional view showing the sensor taken along line XVIB-XVIB in FIG. 16A.

Next, a tenth embodiment mode will be explained on the basis of FIGS. 16A and 16B. FIGS. 16A and 16B are views showing the schematic construction of a magnetic sensor in accordance with the tenth embodiment mode, where FIG. 16A is a plan view and FIG. 16B is a cross-sectional view along line XVIB-XVIB of FIG. 16A.

The magnetic sensor in accordance with the tenth embodiment mode is common to the magnetic sensor 100 shown in each of the first to ninth embodiment modes in many portions.

As shown in FIGS. 16A and 16B, the magnetic sensor 200 in accordance with this embodiment mode basically has a structure and a driving mode similar to those of the magnetic sensor 100 in accordance with the first embodiment mode. However, this embodiment mode is characterized in that a semiconductor area 112 is divided into three portions, and nine electrodes 115a to 115i are arranged.

Similar to the magnetic sensor 100 shown in the first embodiment mode, in the magnetic sensor 200 in accordance with this embodiment mode, a Hall element 110 of the vertical type is also formed in a substrate (semiconductor substrate) 111 constructed by a single electric conductivity type. The Hall element 110 is formed by utilizing a CMOS process. The Hall element 110 of the vertical type is constructed by arranging a silicon substrate (P-sub) of P-type as the substrate 111 having e.g., a (110)-plane as a cut face, and a semiconductor area (N-well) 112 of N-type formed as a diffusion layer (well) by introducing electric conductivity type impurities of N-type onto the substrate surface. This semiconductor area 112 is formed in a shape surrounded by the substrate 111.

A diffusion layer (P-type diffusion separating wall) 113 constructed by P-type is formed in the substrate 111 to separate the Hall element 110 from the other elements. In an area (active area) surrounded by this diffusion area 113 on the surface of the semiconductor area 112, contact areas (N$^+$-diffusion layer) 114a to 114i are formed in a shape for selectively raising impurity concentration (N-type) of this surface. Thus, preferable ohmic contact is formed between each of these contact areas 114a to 114f and electrodes 115a to 115i arranged in these contact areas.

Three electrodes 115a, 115c, 115i formed along line XVIB-XVIB, i.e., formed in one straight line shape among the nine electrodes 115a to 115i correspond to a first electrode group. The electrode 115a of one end side constituting the first electrode group is arranged between two electrodes 115e, 115f. The central electrode 115c constituting the first electrode group is arranged between electrodes 115g, 115h. The electrode 115i of the other end side constituting the first electrode group is arranged between two electrodes 115b, 115d. Namely, electrodes 115b, 115d to 115f correspond to a second electrode group.

Further, electrodes 115f and 115d (electrodes 115e and 115b) of the same side with respect to a straight line (line XVIB-XVIB) formed by the first electrode group in the electrode pairs of both ends among six electrodes 115b, 115d to 115f constituting the second electrode group are electrically connected by wiring 116a (wiring 116b) formed on the substrate through the electrode 115g (electrode 115h) of the side reverse to an electrode of the same side with respect to the straight line (line XVIB-XVIB) in a central electrode pair nipped by the electrode pairs of both the ends. Further, electrodes 115a, 115i of both the ends among three electrodes 115a, 115c, 115i constituting the first electrode group are electrically connected by wiring 116c formed on the substrate.

In this embodiment mode, in six electrodes 115b, 115d to 115f constituting the second electrode group, electrodes 115e and 115f, electrodes 115g and 115h and electrodes 115b and 115d are respectively arranged so as to have the relation of line symmetry with respect to the straight line (line XVIB-XVIB) formed by three electrodes 115a, 115c, 115i constituting the first electrode group. Further, wirings 116a, 116b are set such that wiring resistances mutually become approximately equal. In this embodiment mode, these wirings are constructed by the same material (e.g., aluminum), and are set such that sections and wiring lengths mutually become approximately equal.

Further, as shown in FIG. 16A, an area (active area) surrounded by the diffusion layer 113 is divided into areas 112a to 112c separated by diffusion layers (P-type diffusion separating walls) 113a, 113b of P-type through PN junction separation using each diffusion layer. Here, diffusion layers 113a, 113b correspond to an electric potential barrier, and have a diffusion depth shallower than the semiconductor area 112, and form an electric current passage by selectively narrowing the vicinity of a bottom face of the semiconductor area 112. As shown in FIG. 16B, in areas 112a to 112c, an area electrically partitioned is also formed within the substrate. The area electrically partitioned within the substrate of these areas 112a to 112c becomes a magnetic detecting portion HP. In areas 112a to 112c, contact areas 114a, 114e, 114f (electrodes 115a, 115e, 115f) are formed in area 112a, and contact areas 114c, 114g, 114h (electrodes 115c, 115g, 115h) are formed in area 112b, and contact areas 114b, 114d, 114i (electrodes 115b, 115d, 115i) are formed in area 112c.

Further, one (115a in this example) of electrodes 115a, 115i of both the ends and the central electrode 115c nipped by electrodes 115a, 115i of both the ends in the first electrode group are set to a first electrode pair. One of the electrode pairs of both the ends in the second electrode group is set to a second electrode pair (the pair of electrodes 115b and 115d in this example). As shown in FIGS. 16A and 16B, terminal V1 is electrically connected to electrode 115a, and terminal V2 is electrically connected to electrode 115b, and terminal V3 is electrically connected to electrode 115c, and terminal V4 is electrically connected to electrode 115d. Terminals V1 and V3 among these four terminals V1 to V4 constitute a pair, and terminals V2 and V4 constitute a pair.

For example, when a voltage is applied between terminal V1 and terminal V3 constituting a pair and a constant driving electric current is supplied from the electrode 115a to the semiconductor area 112, the driving electric current is flowed from the contact area 114a to the contact area 114c through the magnetic detecting portion HP and a downward portion of the diffusion layer 113a. Namely, in this case, the electric current including a component perpendicular to the substrate surface is flowed to the magnetic detecting portion HP. Therefore, when a magnetic field (the magnetic field shown by arrow B within FIG. 16A) including a component parallel to the substrate surface is applied to the magnetic detecting portion HP of the Hall element 10 in a flowing state of this driving electric current, a Hall voltage $V_H$ corresponding to this magnetic field is generated by the Hall effect between terminal V2 and terminal V4 constituting a pair. Accordingly, a magnetic field component as a detecting object, i.e., a magnetic field component parallel to the surface of the substrate used in the Hall element 10 is calculated by detecting a Hall voltage signal generated through terminal V2 and terminal V4. Further, a flowing direction of the driving electric current in this Hall element 10 is arbitrary, and the magnetic field (magnetism) can be also detected by oppositely setting the direction of the above driving electric current. Further, the magnetic field (magnetism) can be also detected by reversely setting the terminal pair for flowing the driving electric current and the terminal pair for detecting the Hall voltage.

Further, similar to the first embodiment mode, voltage detection using terminals V2 and V4 executed by flowing the driving electric current from terminal V1 to terminal V3, and voltage detection using terminals V3 and V1 executed by flowing the driving electric current from terminal V2 to terminal V4 are repeatedly performed in a predetermined period so that the offset voltage can be reduced (canceled).

Thus, effects similar to those of the first embodiment mode can be also expected by the magnetic sensor 200 in accordance with this embodiment mode. Further, since the number of electrodes is increased in comparison with the construction shown in the first embodiment mode, the offset voltage (unbalance voltage) is averaged and magnetic detection accuracy as the magnetic sensor 100 can be improved.

Further, the magnetic sensor 200 in accordance with this embodiment mode is also constructed so as to perform voltage detection using terminals V4 and V2 executed by flowing the driving electric current from terminal V3 to terminal V1, and voltage detection using terminals V1 and V3 executed by flowing the driving electric current from terminal V4 to terminal V2. The magnetism (magnetic field) can be also detected by these two combinations while the offset voltage is canceled. Namely, if it is a driving mode able to detect the magnetism (magnetic field) by switching the terminal pair (electrode pair) for the driving electric current and the flowing direction of the driving electric current (by performing the spinning current) while the offset voltage is reduced (canceled), this driving mode can be adopted. For example, the driving electric current may be flowed in four combinations (see FIG. 3) as shown in the first embodiment mode, and the offset voltage may be also reduced (canceled) while the Hall voltage is averaged.

The construction shown in each of the second to ninth embodiment modes can be also adopted with respect to the magnetic sensor 200 in accordance with this embodiment mode.

Further, in this embodiment mode, the semiconductor area 112 is divided into three areas 112a to 112c. Two electrodes constituting the second electrode group are arranged in a mode for nipping one electrode constituting the first electrode group every areas 112a to 112c. In areas 112a and 112b (areas 112b and 112c) having an adjacent relation, electrodes 115f and 115g (electrodes 115g and 115d) and electrodes 115e and 115h (electrodes 115h and 115b) having a relation for nipping a straight line (line XVIB-XVIB) formed by first electrodes 115a, 115c, 115i are respectively connected by wirings 116a, 116b. Namely, in addition to the construction shown in this embodiment mode, effects similar to those of this embodiment mode can be also expected if it is set to e.g., a construction in which the semiconductor area 12 is divided into odd portions, and electrodes having a relation for nipping a straight line formed by a first electrode are electrically connected through wiring in an area having an adjacent relation.

Eleventh Embodiment Mode

Figure 17A:
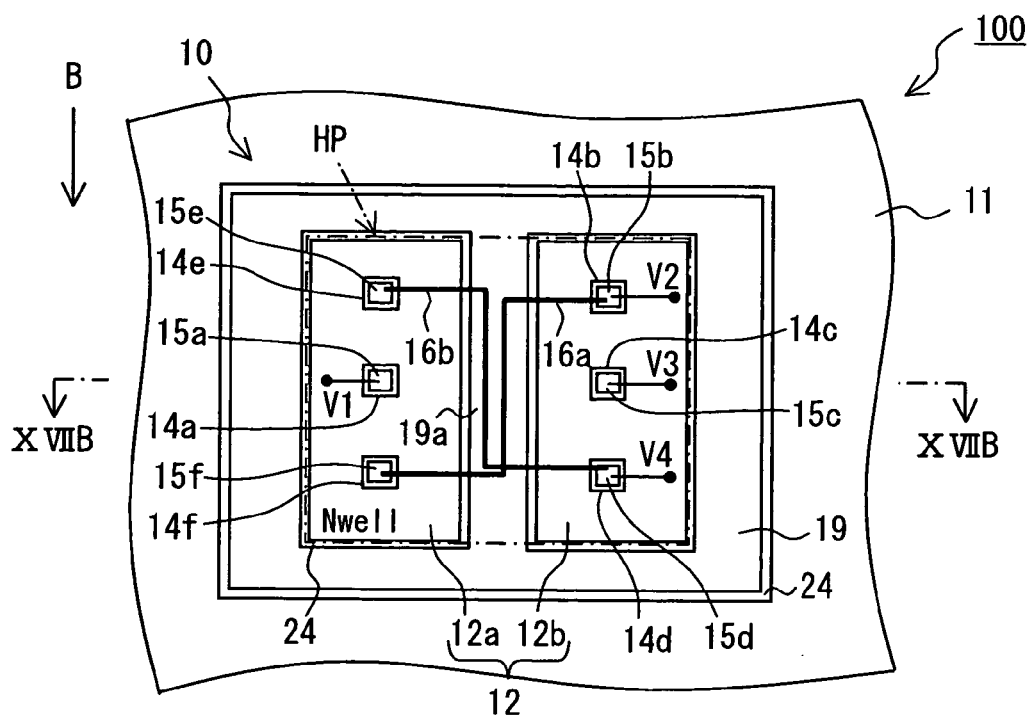
FIG. 17A is a plan view showing a magnetic sensor according to an eleventh embodiment mode.
Figure 17B:
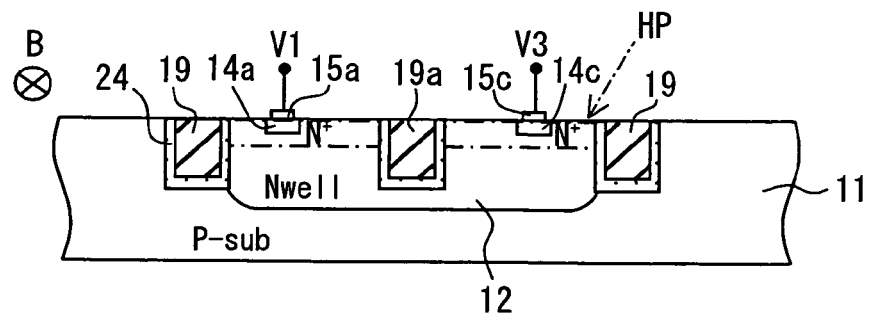
FIG. 17B is a cross sectional view showing the sensor taken along line XVIIB-XVIIB in FIG. 17A.

Next, an eleventh embodiment mode will be explained on the basis of FIGS. 17A and 17B. FIGS. 17A and 17B are views showing the schematic construction of a magnetic sensor in accordance with the eleventh embodiment mode, where FIG. 17A is a plan view and FIG. 17B is a cross-sectional view along line XVIIB-XVIIB of FIG. 17A.

The magnetic sensor in accordance with the eleventh embodiment mode is common to the magnetic sensor 100 shown in the first embodiment mode in many portions.

As shown in FIGS. 17A and 17B, the magnetic sensor 100 in accordance with this embodiment mode basically approximately has the same structure as the magnetic sensor 100 shown in the first embodiment mode, and its operation mode is also set as mentioned above. In this embodiment mode, similar to FIGS. 4A and 4B shown in the first embodiment mode, a trench 19a is adopted as an electric potential barrier, and the semiconductor area 12 is surrounded by a trench 19. The surfaces of the trenches 19, 19a are covered with a diffusion layer 24 of P-type.

Here, in the case of a construction in which the trenches 19, 19a directly come in contact with the semiconductor area 12, there is a fear that a carrier flowed to the semiconductor area 12 is fluctuated by an insulating film (e.g., oxide film), etc. within the trenches 19, 19a, and noises are caused. This is because a coupling hand of a silicon atom constituting the substrate 11 is in excess by forming the trenches 19, 19a in the substrate 11. In contrast to this, in this embodiment mode, the surfaces of the trenches 19, 19a are covered with the diffusion layer 24 as an electric conductivity type different from that of the semiconductor area 12, and a bias reverse to that of the semiconductor area 12 is applied to the diffusion layer 24. Accordingly, the fluctuation of the carrier flowed to the semiconductor area 12 can be restrained by PN junction separation.

This embodiment mode shows an example for arranging the diffusion layer 24 with respect to the construction (FIGS. 4A and 4B) shown in the first embodiment mode. However, effects similar to the above effects can be also obtained with respect to the construction (FIGS. 6A and 6B) shown in the second embodiment mode by arranging the diffusion layer 24.

Twelfth Embodiment Mode

Figure 18A:
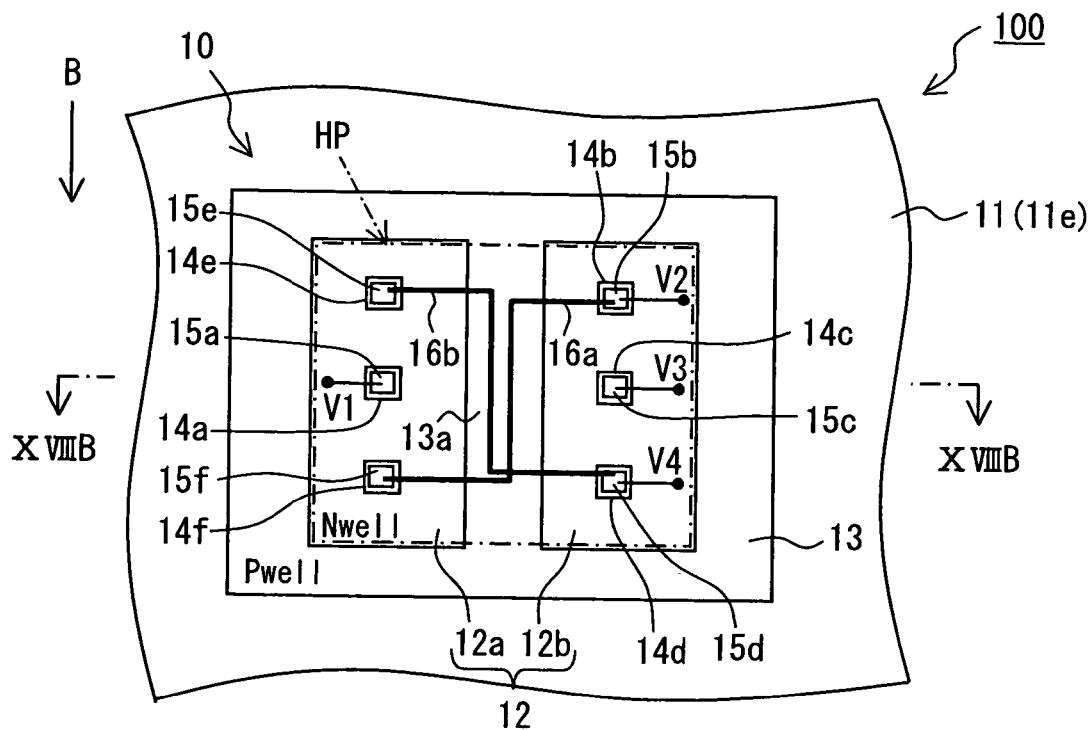
FIG. 18A is a plan view showing a magnetic sensor according to a twelfth embodiment mode.
Figure 18B:
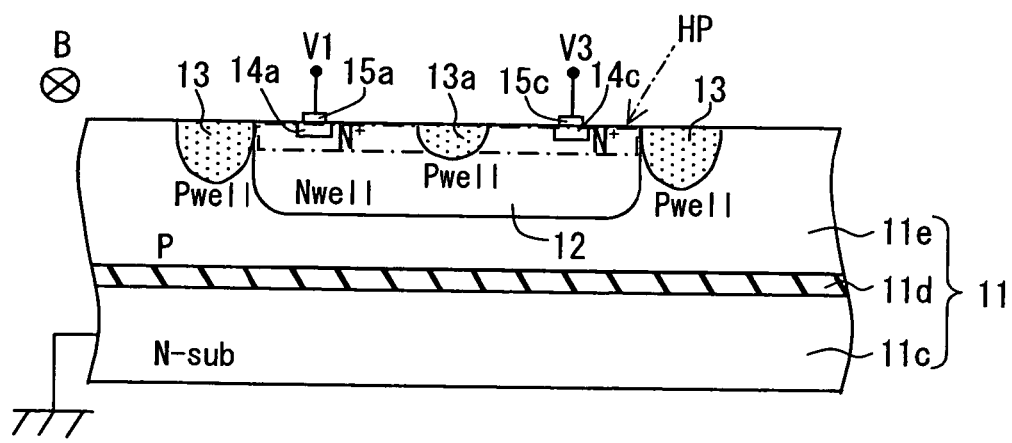
FIG. 18B is a cross sectional view showing the sensor taken along line XVIIIB-XVIIIB in FIG. 18A.

Next, a twelfth embodiment mode will be explained on the basis of FIGS. 18A and 18B. FIGS. 18A and 18B are views showing the schematic construction of a magnetic sensor in accordance with the twelfth embodiment mode, where FIG. 18A is a plan view and FIG. 18B is a cross-sectional view along line XVIIIB-XVIIIB of FIG. 18A.

The magnetic sensor in accordance with the twelfth embodiment mode is common to the magnetic sensor 100 shown in the first embodiment mode in many portions. Accordingly, in the following description, detailed explanations of the common portions are omitted and different portions will be preponderantly explained.

As shown in FIGS. 18A and 18B, the magnetic sensor 100 in accordance with this embodiment mode basically approximately has the same structure as the magnetic sensor 100 shown in the first embodiment mode, and its operation mode is also set as mentioned above. In this embodiment mode, the substrate 11 is constructed by a support substrate 11c formed by e.g., silicon of N-type, an insulating layer 11d arranged on the support substrate 11c and formed by e.g., a silicon oxide film, and a semiconductor layer 11e formed by e.g., epitaxial growth on the support substrate 11c through the insulating layer 11d and constructed by silicon of P-type. A semiconductor area 12 of N-type is constructed in a rear face surface layer of a connection face with the insulating layer 11d in the semiconductor layer 11e as the semiconductor substrate.

Thus, a construction similar to that of the substrate 11 shown in the first embodiment mode can be also realized with respect to the semiconductor layer 11e (the semiconductor layer 11e of the SOI structure substrate 11 in this embodiment mode) constructed on the support substrate 11c through the insulating layer 11d.

Further, in this embodiment mode, as shown in FIG. 18B, the support substrate 11c is fixed to a predetermined electric potential (ground electric potential in FIG. 18B). When such a construction is adopted, a noise from the lower direction of the substrate 11 (Hall element 10) is shielded and the Hall element can be also protected from the noise. In particular, a noise resisting property of the Hall element 10 can be further raised in combination with a shield structure with respect to a noise from the upper direction of the substrate 11 shown in the third to fifth embodiment modes. The predetermined electric potential is not limited to the ground electric potential, but can be also fixed to e.g., the electric potential of an electric power source.

Figure 19:
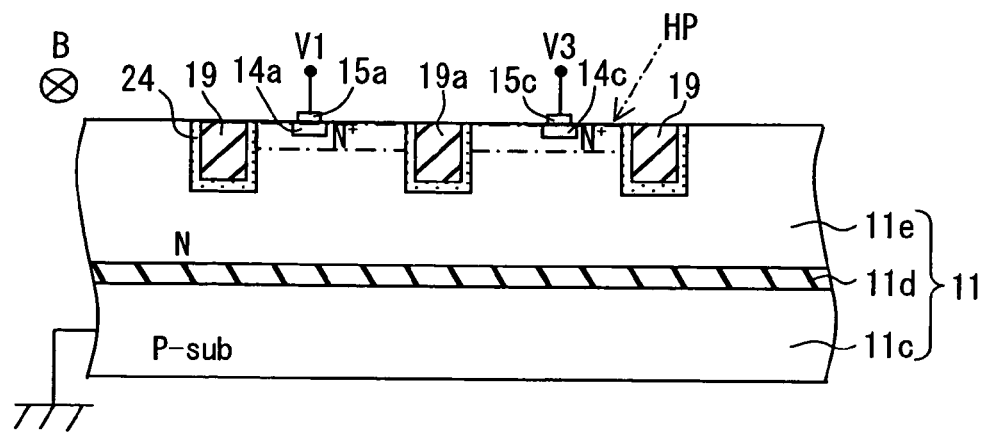
FIG. 19 is a cross sectional view showing a magnetic sensor according to a modification of the twelfth embodiment mode.

This embodiment mode shows an example for adopting the substrate 11 (semiconductor layer 11e) of the SOI structure with respect to the construction shown in the first embodiment mode. However, a combination with the construction shown in each of the above embodiment modes can be made. For example, as shown in FIG. 19, a construction similar to that of the semiconductor layer 11b shown in the second embodiment mode can be also realized in the semiconductor layer 11e in the substrate 11 which is constructed by a support substrate 11c formed by e.g., silicon of P-type, an insulating layer 11d arranged on the support substrate 11c and formed by e.g., a silicon oxide film, and a semiconductor layer 11e formed by e.g., epitaxial growth on the support substrate 11c through the insulating layer 11d and constructed by silicon of N-type. In FIG. 19, similar to FIGS. 6A and 6B of the second embodiment mode, trenches 19, 19a burying an insulating film therein are adopted as first and second electric potential barriers. Similar to the second embodiment mode, magnetism can be also detected by such a construction. Further, as shown in the eleventh embodiment mode, since the surfaces of the trenches 19, 19a are covered with the diffusion layer 24, the fluctuation of a carrier flowed to the semiconductor area 12 can be restrained. In addition to the trenches 19, 19a, diffusion areas 17, 17a of P-type can be also adopted as the first and second electric potential barriers as mentioned above. FIG. 19 is a cross-sectional view showing a modified example.

Figure 20:
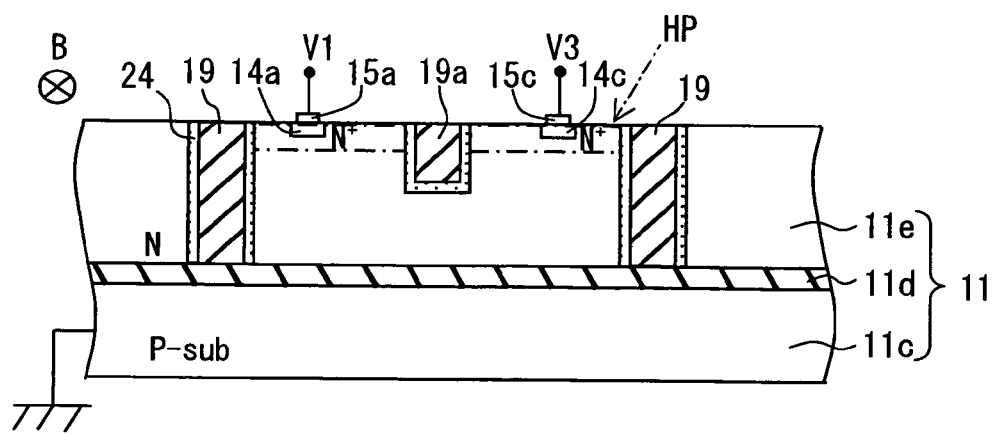
FIG. 20 is a cross sectional view showing a magnetic sensor according to another modification of the twelfth embodiment mode.

Further, in a construction for forming the trenches 19, 19a in the semiconductor layer 11e constituting the substrate 11, as shown in FIG. 20, it is preferable that the depth of the trench 19 as the first electric potential barrier is set to be deeper than the depth of the trench 19a as the second electric potential barrier. When such a structure is set, the flowing direction and range of the driving electric current can be further narrowed by the trench 19. Accordingly, the driving electric current is easily flowed in the longitudinal direction in the magnetic detecting portion HP, and high accuracy formation of the magnetic sensor 100 can be expected. Such effects are not limited to the semiconductor layer 11b of the substrate 11 shown in this embodiment mode. Such effects can be also applied to the semiconductor layer 11b of the substrate 11 shown in the second embodiment mode. Further, although the above structure is applied to the trenches 19, 19a, the structure may be also applied to the first and second electric potential barriers. FIG. 20 is a cross-sectional view showing a modified example.

Thirteenth Embodiment Mode

Figure 21:
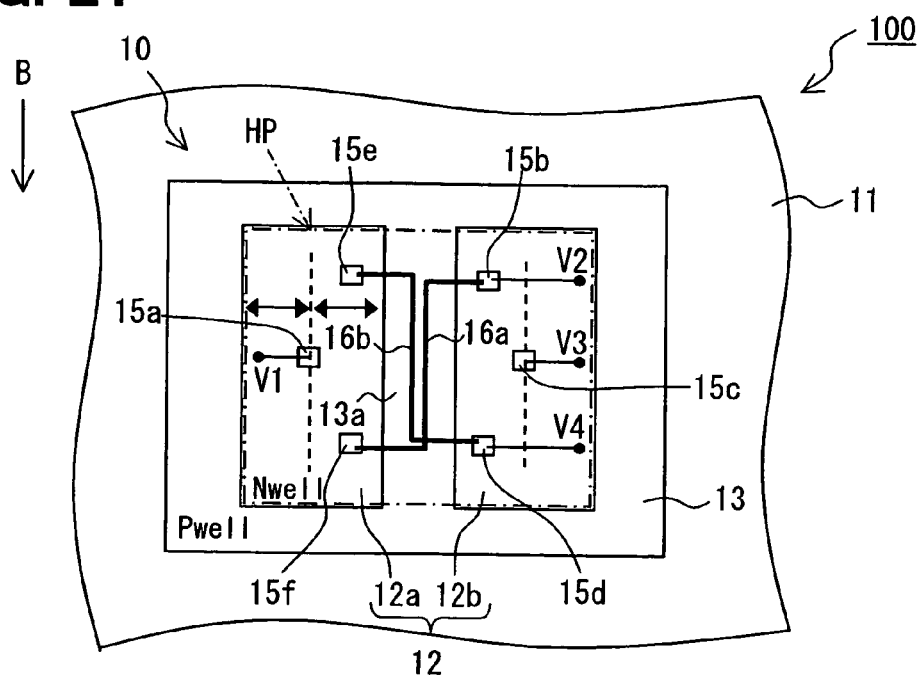
FIG. 21 is a plan view showing a magnetic sensor according to a thirteenth embodiment mode.

Next, a thirteenth embodiment mode will be explained on the basis of FIG. 21. FIG. 21 is a plan view showing the schematic construction of a magnetic sensor in accordance with a thirteenth embodiment mode.

The magnetic sensor in accordance with the thirteenth embodiment mode is common to the magnetic sensor 100 shown in the first embodiment mode in many portions.

The first embodiment mode shows an example in which one electrode 15a (15c) constituting the first electrode group in a partitioned area 12a (12b) in the semiconductor area 12, and one electrode pair 15e, 15f (15b, 15d) constituting the second electrode group nipping this electrode 15a (15c) therebetween are arranged in one straight line shape along the diffusion layer 13a as an electric potential barrier in a planar direction of the substrate 11. In the Hall element 10 of the vertical type, the shape of the Hall element 10 (the arrangement of the electrode) is set to a deformed shape with respect to an ideal shape (e.g., the lateral Hall element shown in FIG. 27A). Thus, in the deformed shape, the Rorentz effect near the electrode is deflected and an area for weakening a Hall electric field near the electrode is increased. Therefore, a curve is caused in an electric current passage using the magnetic field. As its result, resistance is increased, and sensitivity is reduced with respect to the ideal shape.

Therefore, in this embodiment mode, as shown in FIG. 21, the positions of respective electrodes 15a to 15f are determined such that the distance between electrodes 15b and 15e and the distance between electrodes 15d and 15f located on the same side with respect to a straight line formed by electrodes 15a, 15c constituting the first electrode group (first electrode pair) among electrodes 15b, 15d to 15f constituting the second electrode group in the planar direction of the substrate 11 become shorter than the distance between electrodes 15a and 15c constituting the first electrode group. More concretely, as shown in FIG. 21, electrodes 15a, 15c constituting the first electrode group (first electrode pair) are approximately formed in the central positions (broken lines shown in FIG. 21) of respective areas 12a, 12b in a direction for partitioning the semiconductor area 12 by the diffusion layer 13a as an electric potential barrier. In contrast to this, respective electrodes 15b, 15d to 15f constituting the second electrode group are formed so as to approach the side of diffusion layer 13a (electric potential barrier) from the approximately central positions of respective areas 12a, 12b in a direction partitioned by diffusion layer 13a as the electric potential barrier. As this result, the distance between electrodes 15b and 15e and the distance between electrodes 15d and 15f are respectively shorter than the distance between electrodes 15a and 15c. When such a construction is adopted, the influence of a shape effect of the above element can be reduced in comparison with a construction (the construction that the distance between electrodes 15b and 15e (between electrodes 15d and 15f) located on the same side is equal to the distance between electrodes 15a and 15c constituting the first electrode group) in which one electrode 15a (15c) constituting the first electrode group and one electrode pair 15e, 15f (15b, 15d) constituting the second electrode group are arranged in one straight line shape in respective areas 12a, 12b. Namely, sensitivity of the magnetic sensor 100 (Hall element 10) can be improved.

Further, this embodiment mode shows an example for applying the arrangement of each of electrodes 15a to 15f to the construction shown in the first embodiment mode. However, effects similar to the above effects can be also obtained by applying the arrangement of electrodes 15a to 15f shown in this embodiment mode to the construction shown in each of the embodiment modes except for the tenth embodiment mode.

Fourteenth Embodiment Mode

Figure 22:
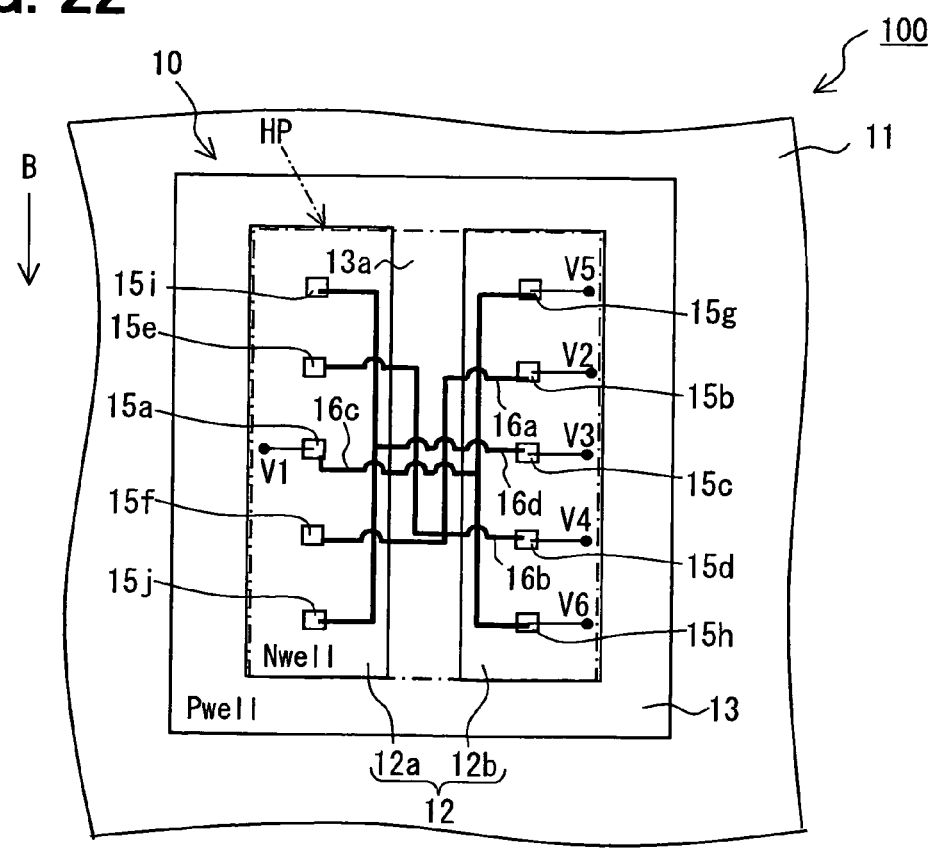
FIG. 22 is a plan view showing a magnetic sensor according to a fourteenth embodiment mode.

Next, a fourteenth embodiment mode will be explained on the basis of FIG. 22. FIG. 22 is a plan view showing the schematic construction of a magnetic sensor in accordance with the fourteenth embodiment mode. In FIG. 22, for convenience, a contact area 14 is omitted in the illustration.

The magnetic sensor in accordance with the fourteenth embodiment mode is common to the magnetic sensor 100 shown in the first embodiment mode in many portions.

The first embodiment mode shows an example in which one electrode 15a (15c) constituting the first electrode group (first electrode pair) and one electrode pair 15e, 15f (15b, 15d) constituting the second electrode group nipping this electrode 15a (15c) therebetween are arranged in the partitioned area 12a (12b) of the semiconductor area 12. In contrast to this, in this embodiment mode, as shown in FIG. 22, electrodes 15i, 15j (15g, 15h) are arranged in the partitioned area 12a (12b) such that one electrode 15a (15c) constituting the first electrode group and one electrode pair 15e, 15f (15b, 15d) constituting the second electrode group nipping this electrode 15a (15c) therebetween are nipped between these electrodes 15i, 15j (15g, 15h). At least one electrode pair (hereinafter shown as an auxiliary electrode pair 15i, 15j (15g, 15h)) formed by electrodes 15i, 15j (15g, 15h) is formed with respect to each electrode 15a (15c) constituting the first electrode group. Electrode 15a (15c) is respectively electrically connected to an auxiliary electrode pair 15g, 15h (15i, 15j) nipping electrode 15c (15a) therebetween constituting the first electrode group different from the electrode 15a (15c) by wirings 16c, 16d. The magnetic sensor 100 constructed in this way has the same operation and driving mode as the construction shown in the first embodiment mode.

When such a construction is set, dispersions of the shape and size of electrode 15 are averaged and the offset voltage (unbalance voltage) is reduced while being averaged in comparison with a construction having no auxiliary electrode pair 15i, 15j (15g, 15h). Accordingly, magnetic detection accuracy as the magnetic sensor 100 is highly maintained.

The construction shown in FIG. 22 shows an example for respectively arranging one auxiliary electrode pair 15i, 15j (15g, 15h) correspondingly to one electrode 15a (15c) constituting the first electrode group (first electrode pair). However, a construction for arranging plural auxiliary electrode pairs with respect to one electrode 15a (15c) (e.g., an auxiliary electrode pair for nipping electrodes 15i, 15j therebetween is further arranged) may be also set. Thus, even when the number of auxiliary electrode pairs is plural (so many folds), electrode 15a (15c) may be respectively electrically connected to all the auxiliary electrode pairs nipping electrode 15c (15a) therebetween constituting the first electrode group different from this electrode 15a (15c).

Figure 23:
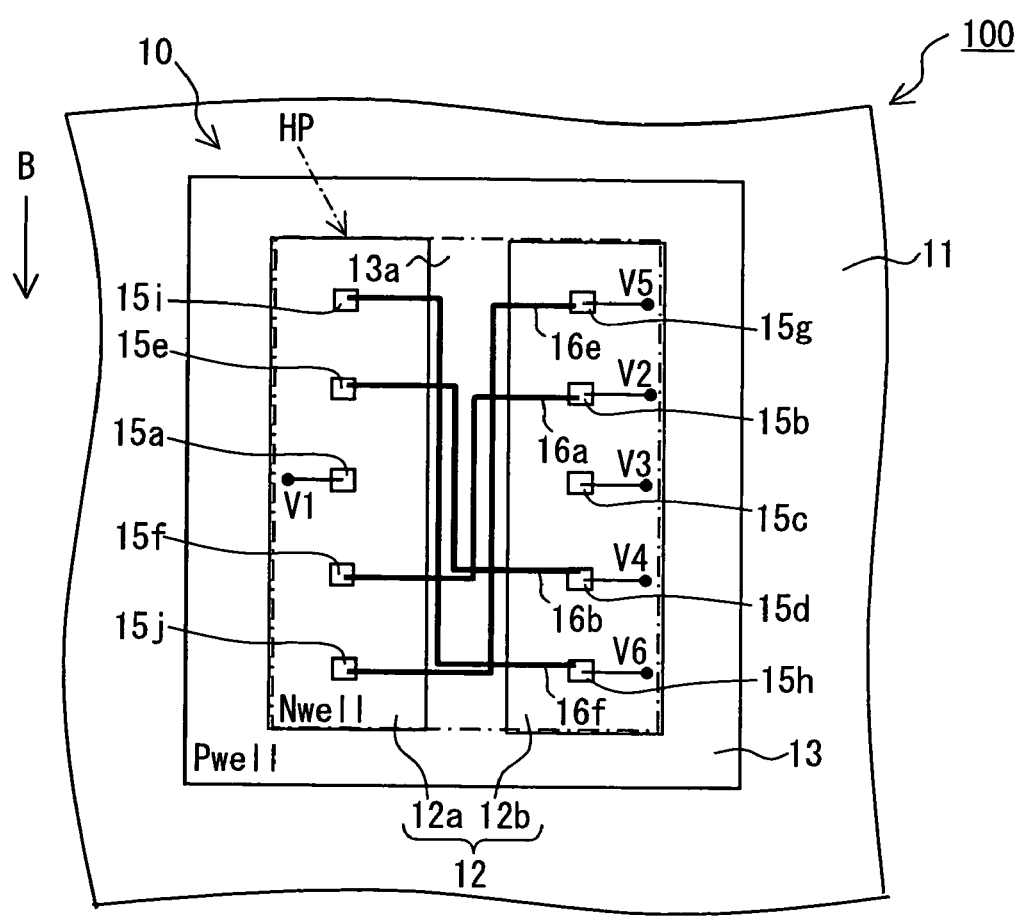
FIG. 23 is a plan view showing a magnetic sensor according to a modification of the fourteenth embodiment mode.

Further, the following wiring structure can be also set in a construction in which at least one auxiliary electrode pair mentioned above is formed with respect to each electrode 15a (15c) constituting the first electrode group in addition to electrodes 15a to 15f constituting the first electrode group and the second electrode group. Concretely, as shown in FIG. 23, it may be set to a construction in which corresponding electrodes 15a, 15c are different, and electrodes (electrodes 15i and 15h and electrodes 15j and 15g) having a relation for nipping a straight line formed by the first electrode group are respectively electrically connected by wirings 16e, 16f arranged on the substrate 11 in an auxiliary electrode pair (auxiliary electrode pair 15i, 15j and auxiliary electrode pair 15g, 15h) in which the number of electrodes 15 nipped therebetween is equal. In such a construction, one of electrode pair 15a, 15c constituting the first electrode group, and one auxiliary electrode pair 15i, 15j (auxiliary electrode pair 15g, 15h) of auxiliary electrode pairs equal in one electrode pair 15b, 15d (15e, 15f) constituting the second electrode group and the number of electrodes 15 nipped therebetween is set to an electrode pair for the driving electric current for supplying the driving electric current. The other is set to an electrode pair for the Hall voltage for detecting the Hall voltage. When such setting is performed, the offset voltage can be reduced together with the detection of the magnetic field (magnetism). FIG. 23 is a plan view showing a modified example.

For example, when a voltage is applied between terminal V1 and terminal V3 constituting a pair and a constant driving electric current is supplied from the electrode 15a to the semiconductor area 12, the driving electric current is flowed to the electrode 15c through the magnetic detecting portion HP and a downward portion of the diffusion layer 13a. Namely, the electric current including a component perpendicular to the substrate surface is flowed to the magnetic detecting portion HP. Therefore, when the magnetic field (the magnetic field shown by arrow B within FIG. 23) including a component parallel to the substrate surface is applied to the magnetic detecting portion HP of the Hall element 10 in a flowing state of this driving electric current, a Hall voltage $V_H$ corresponding to this magnetic field is generated by the Hall effect between terminal V2 and terminal V4 constituting a pair and between terminal V5 and terminal V6 constituting a pair. Accordingly, a magnetic field component as a detecting object, i.e., a magnetic field component parallel to the surface of the substrate used in the Hall element 10 is calculated by detecting (adding) Hall voltage signals generated through terminals V2, V4 and terminals V5, V6. Further, the flowing direction of the driving electric current is arbitrary in this Hall element 10, and the magnetic field (magnetism) can be also detected by oppositely setting the direction of the above driving electric current. Further, the magnetic field (magnetism) can be also detected by reversely setting the terminal pair for flowing the driving electric current and the terminal pair for detecting the Hall voltage. When terminals V1, V3 are set to the detection side, the magnetic field component as a detecting object is calculated by respectively applying voltages between terminal V2 and terminal V4 and between terminal V5 and terminal V6, and detecting (adding) Hall voltage signals respectively correspondingly generated in terminals V1, V3. In this construction, similar to the first embodiment mode, the offset voltage can be also reduced (canceled) by switching an electrode pair for the driving electric current and a detection pair for the Hall voltage in a predetermined period.

In the construction shown in FIG. 23, similar to the construction shown in FIG. 22, a construction for arranging plural auxiliary electrode pairs (e.g., an auxiliary electrode pair for nipping electrodes 15$i$, 15$j$ therebetween is further arranged) with respect to one electrode 15$a$ (15$c$) may be also set. Thus, even when the number of auxiliary electrode pairs is plural (so many folds), it may be set to a construction in which corresponding electrodes 15$a$, 15$c$ are different, and electrodes having a relation for nipping a straight line formed by the first electrode group are respectively electrically connected in the auxiliary electrode pair having an equal number of electrodes 15 nipped therebetween. The auxiliary electrode pair may be then set to the electrode pair for the driving electric current or the detection pair for the Hall voltage together with one electrode pair constituting the second electrode group.

Further, this embodiment mode shows an example for arranging auxiliary electrode pair 15$i$, 15$j$ (15$g$, 15$h$) with respect to the construction shown in the first embodiment mode. However, effects similar to the above effects can be also obtained by applying the auxiliary electrode pair 15$i$, 15$j$ (15$g$, 15$h$) shown in this embodiment mode to the construction shown in each of the embodiment modes except for the tenth embodiment mode.

Fifteenth Embodiment Mode

Figure 24:
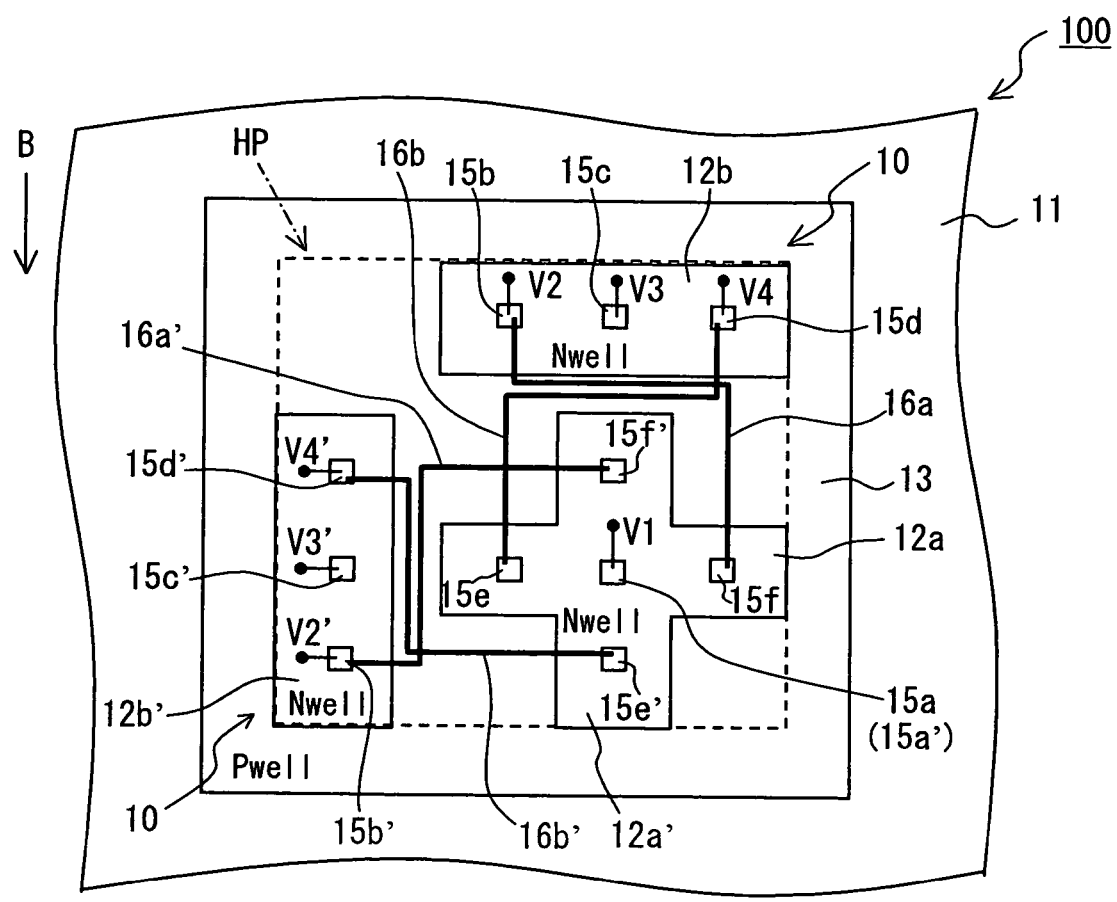
FIG. 24 is a plan view showing a magnetic sensor according to a fifteenth embodiment mode.

Next, a fifteenth embodiment mode will be explained on the basis of FIG. 24. FIG. 24 is a plan view showing the schematic construction of a magnetic sensor in accordance with the fifteenth embodiment mode. In FIG. 24, for convenience, a contact area 14 is omitted in the illustration.

The magnetic sensor in accordance with the fifteenth embodiment mode is common to the magnetic sensor 100 shown in the seventh embodiment mode in many portions. Accordingly, in the following description, detailed explanations of the common portions are omitted and different portions will be preponderantly explained.

The seventh embodiment mode (FIG. 12) shows an example in which two Hall elements 10 are arranged in shapes perpendicular to each other so as to detect magnetic fields applied from biaxial directions perpendicular to each other. In contrast to this, in this embodiment mode, one of electrodes constituting the first electrode group is mutually commonly used in two Hall elements 10 orthogonally arranged.

Concretely, as shown in FIG. 24, electrode 15$a$ (15$a'$) constituting the first electrode group is commonly used in two Hall elements 10, 10' orthogonally arranged. Further, electrode pair 15$e$, 15$f$ and electrode pair 15$e'$, 15$f'$ are respectively arranged so as to be perpendicular to each other with electrode 15$a$ (15$a'$) between. Partitioned areas 12$a$, 12$a'$ are integrated with each other, and form a planar cross shape. Further, area 12$b$ is arranged so as to be opposed to area 12$a$, and area 12$b'$ is arranged so as to be opposed to area 12$a'$. Electrodes 15$b$ and 15$f$ are electrically connected by wiring 16$a$ and electrodes 15$d$ and 15$e$ are electrically connected by wiring 16$b$ so as to nip a straight line formed by first electrode group 15$a$, 15$c$ constituting the Hall element 10. Further, electrodes 15$b'$ and 15$f'$ are electrically connected by wiring 16$a'$ and electrodes 15$d'$ and 15$e'$ are electrically connected by wiring 16$b'$ so as to nip a straight line formed by first electrode group 15$a'$, 15$c'$ constituting the Hall element 10'.

In the magnetic sensor 100 constructed in this way, for example, suitable processing (arithmetic processing) is performed with respect to Hall voltage signals from the two Hall elements 10, 10' orthogonally arranged through a peripheral, circuit arranged in the substrate 11, a signal processing circuit arranged separately from the substrate 11, etc. Thus, the magnetic field can be detected from all directions on one plane, e.g., at a wide angle of 360°. Namely, two-dimensional detection can be performed in addition to the effects described in the first embodiment mode.

Further, in the two Hall elements 10, 10' orthogonally arranged, the size of the substrate 11 (i.e., the physical constitution of the magnetic sensor 100) in the planar direction can be compactly set in comparison with a construction in which one of electrodes constituting the first electrode group is not commonly used.

This embodiment mode shows an example in which one of electrodes constituting the first electrode group is mutually commonly used in the two Hall elements 10, 10' orthogonally arranged. Alternatively, for example, it is also possible to set a construction for mutually commonly using one of electrodes constituting the first electrode group in two Hall elements 10, 10' arranged in a mode mutually crossing at an acute angle, and effects corresponding to the above effects can be obtained.

Figure 25:
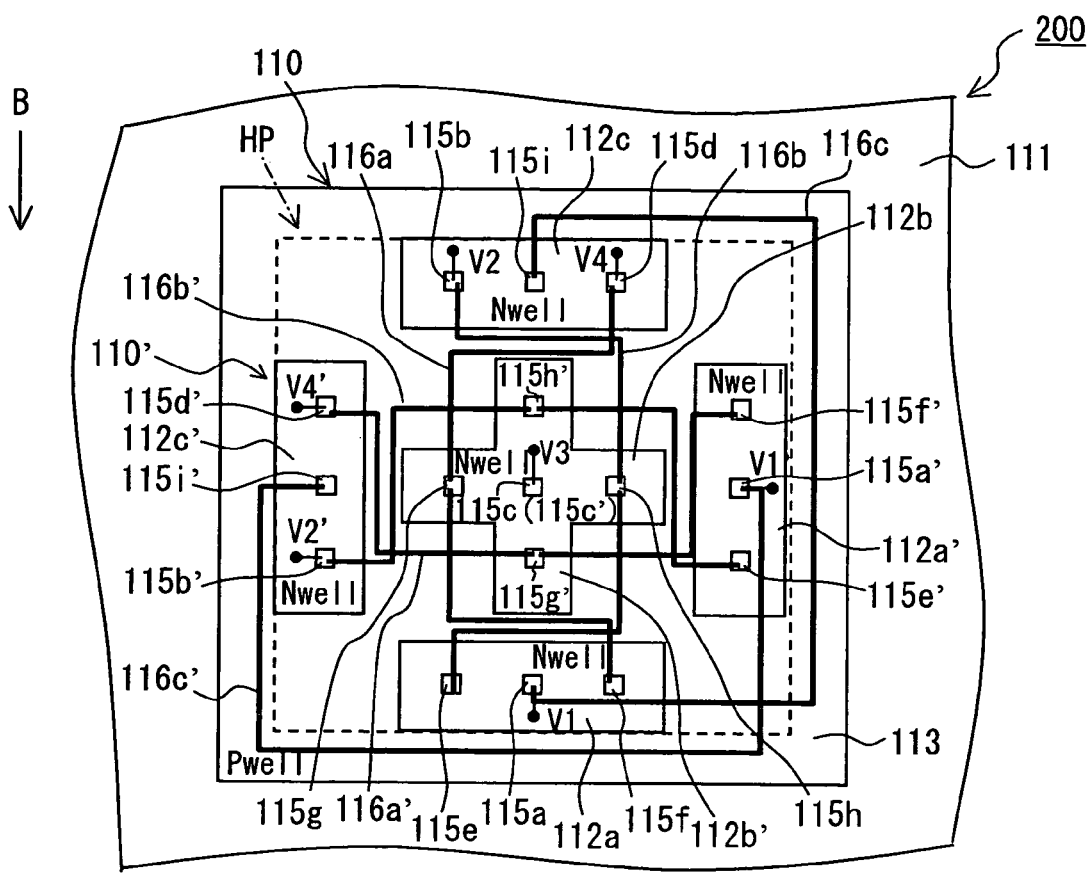
FIG. 25 is a plan view showing a magnetic sensor according to a modification of the fifteenth embodiment mode.
Figure 26A:
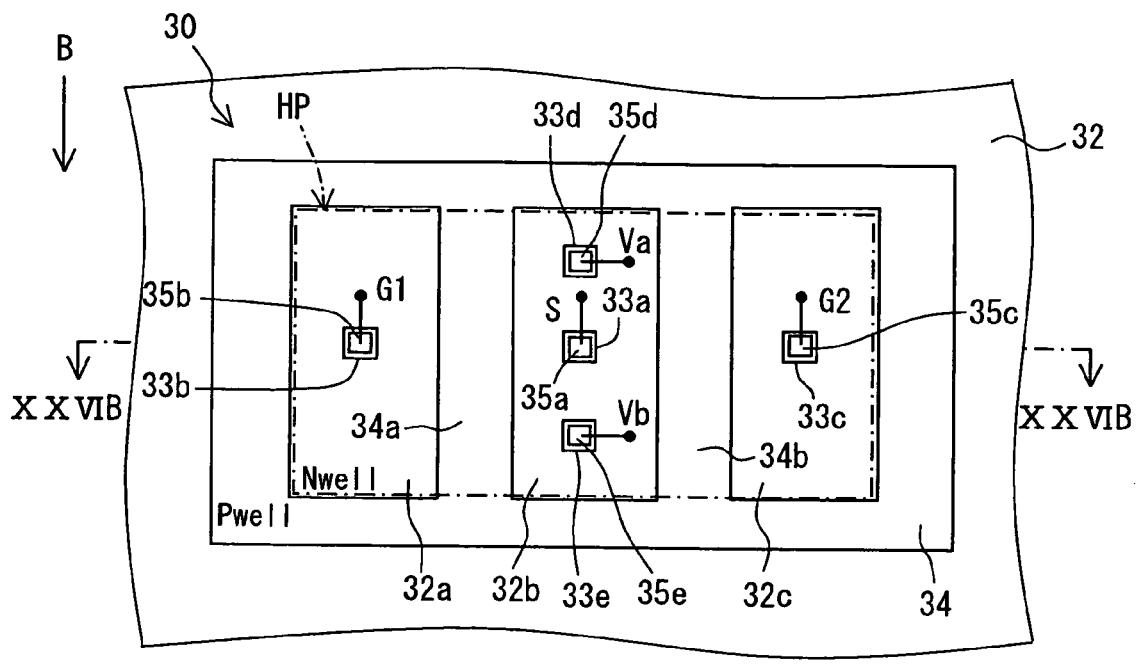
FIG. 26A is a plan view showing a vertical type magnetic sensor according to a prior art.
Figure 26B:
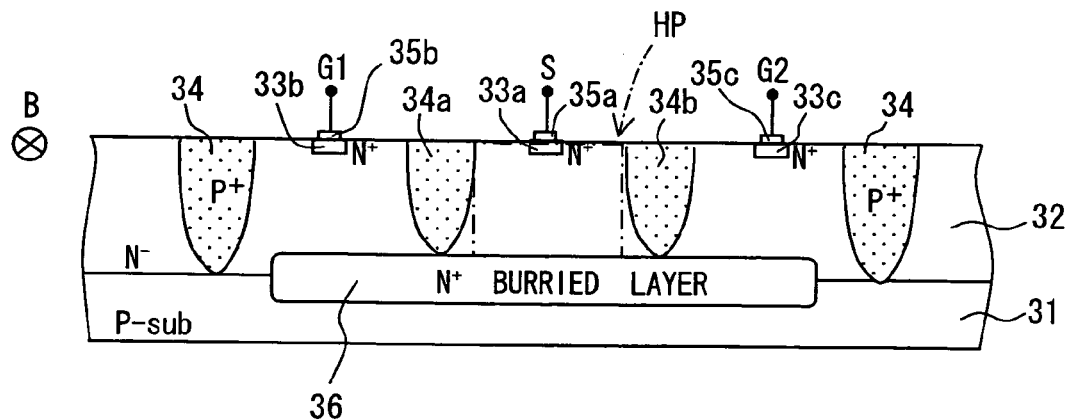
FIG. 26B is a cross sectional view showing the sensor taken along line XXVIB-XXVIB in FIG. 26A.

Further, this embodiment mode shows an example for adopting the construction shown in the first embodiment mode as the Hall element. However, a combination with the construction shown in each of the above embodiment modes can be made. For example, as shown in FIG. 25, the construction shown in the eleventh embodiment mode may be also adopted as the Hall element. In FIG. 25, electrode 115$c$ (115$c'$) constituting the first electrode group is commonly used in two Hall elements 110, 1101 orthogonally arranged. Electrode pair 115$g$, 115$h$ and electrode pair 115$g'$, 115$h'$ are respectively arranged so as to be perpendicular to each other with electrode 115$c$ (115$c'$) between, and partitioned areas 112$b$, 112$b'$ are integrated with each other and are formed in a planar cross shape. Further, areas 112$a$, 112$c$ opposed to area 112$b$ are arranged with area 112$b$ between, and areas 112$a'$, 112$c'$ opposed to area 112$b'$ are arranged with area 112$b'$ between. Electrodes 115$b$, 115$h$, 115$e$ are electrically connected by wiring 116$b$ and electrodes 115$d$, 115$g$, 115$f$ are electrically connected by wiring 116$a$ so as to nip a straight line formed by first electrode group 115$a$, 115$c$, 115$i$ constituting Hall element 110. Further, electrodes 115$a$ and 115$i$ are electrically connected by wiring 116$c$. Similarly, electrodes 115$b'$, 115$h'$, 115$e'$ are electrically connected by wiring 116$b'$ and electrodes 115$d'$, 115$g'$, 115$f'$ are electrically connected by wiring 116$a'$ so as to nip a straight line formed by first electrode group 115$a'$, 115$c'$, 115$i'$ constituting Hall element 110'. Further, electrodes 115$a'$ and 115$i'$ are electrically connected by wiring 116$c'$. In this case, in the two Hall elements 110, 110' orthogonally arranged, the size of the substrate 111 (i.e., the physical constitution of the magnetic sensor 200) in the planar direction can be also compactly set in comparison with a construction in which one of electrodes constituting the first electrode group is not commonly used. FIG. 25 is a plan view showing a modified example. FIG. 25 shows an example in which electrode 115$c$ (115$c'$) located at three centers in the first electrode group is commonly used.

However, one electrode (e.g., electrodes 115 and 115a') located in an end portion may be also commonly used.

The material of the substrate is silicon, by which the Hall element 10 is constructed. However, a material except for silicon can be also used in accordance with a manufacturing process, a structural condition, etc. For example, a chemical compound semiconductor such as GaAs, InSb, InAs, etc. and Ge, etc. can be also suitably adopted. In particular, GaAs and InAs are materials excellent in temperature characteristics, and are suitable for raising of sensitivity of Hall elements 10, 110 (magnetic sensors 100, 200) shown in the present embodiment modes.

The material of the substrate is silicon, and the plane azimuth of silicon is the (100)-plane. However, silicon having a (110)-plane and a (111)-plane as a cut face can be also adopted in consideration of characteristics of a manufacturing process, a circuit, other devices, etc. in addition to plane (100).

The above disclosure has the following aspects.

According to a first aspect of the present disclosure, a magnetic sensor includes: a substrate; a semiconductor region disposed in the substrate and having a predetermined conductive type; a magnetic field detection portion disposed in the semiconductor region; a pair of first electrodes disposed on a surface of the semiconductor region; and two pairs of second electrodes disposed on the surface of the semiconductor region, wherein one pair of second electrodes sandwiches one of first electrodes, and the other pair of second electrodes sandwiches the other one of first electrodes. The one pair of second electrodes includes first and second terminals, and the other pair of second electrodes includes third and fourth terminals. The first and third terminals are disposed on one side of a line connecting between the first electrodes, and the second and fourth terminals are disposed on the other side of the line. The first and fourth terminals are electrically coupled with a first wiring, and the second and third terminals are electrically coupled with a second wiring. The magnetic field detection portion, the first electrodes and the second electrodes provide a vertical Hall element. The vertical Hall element generates a Hall voltage corresponding to a magnetic field when the magnetic field in parallel to the surface of the substrate is applied to the magnetic field detection portion, and a driving current is supplied to the magnetic field detection portion. One of the first and second electrodes supplies the driving current, and the other one of the first and second electrodes detects the Hall voltage.

In the above sensor, the Hall voltage is detected by switching the first and second electrodes between a driving current supply electrode and a Hall voltage detecting electrode so that an offset voltage of the sensor is reduced.

Alternatively, a distance between the first and third terminals may be substantially equal to a distance between the second and fourth terminals, and a distance between the first electrodes may be longer than the distance between the first and third terminals. In this case, shape influence of the sensor is reduced so that sensitivity of the sensor is improved.

Alternatively, the one pair of second electrodes may further include fifth and sixth terminals, and the other pair of second electrodes further includes seventh and eighth terminals. The fifth and sixth terminals sandwich the first and second terminals and the one of first electrodes, and the seventh and eighth terminals sandwich the third and fourth terminals and the other one of first electrodes. The fifth and seventh terminals are disposed on the one side of the line connecting between the first electrodes, and the sixth and eighth terminals are disposed on the other side of the line. The fifth and eighth terminals are electrically coupled with a third wiring, and the sixth and seventh terminals are electrically coupled with a fourth wiring. In this case, varieties in shape and dimensions of the electrode are modified so that an offset voltage, i.e., an unbalance voltage, is uniformed and reduced. Thus, detecting accuracy of the magnetic field is improved.

Alternatively, the one of first electrodes may include first, second and third pads, and the other one of first electrodes may include fourth, fifth and sixth pads. The first and second terminals sandwich the first pad, and the third and fourth terminals sandwich the fourth pad. The second and third pads sandwich the first and second terminals and the first pad, and the fifth and sixth pads sandwich the third and fourth terminals and the fourth pad. The first and third terminals and the second and fifth pads are disposed on the one side of the line connecting between the first and fourth pads, and the second and fourth terminals and the third and sixth pads are disposed on the one side of the line. The first, fifth and sixth pads are electrically coupled with a fifth wiring, and the second, third and fourth pads are electrically coupled with a sixth wiring. In this case, detecting accuracy of the magnetic field is improved.

Alternatively, the first and second terminals may be arranged in a line symmetrical manner with respect to the line connecting between the first electrodes, and the third and fourth terminals may be arranged in a line symmetrical manner with respect to the line. In this case, the offset voltage is much reduced.

Alternatively, the sensor may further include a separation wall disposed in the semiconductor region. The substrate includes a semiconductor substrate having a first conductive type. The semiconductor region is a diffusion layer having a second conductive type. The separation wall has a depth, which is sallower than a depth of the semiconductor region. The separation wall electrically divides the semiconductor region into first and second semiconductor regions. The one of first electrodes and the first and second terminals are disposed in the first semiconductor region. The other one of first electrodes and the third and fourth terminals are disposed in the second semiconductor region. In this case, the sensor can be manufactured by a conventional CMOS process so that a periphery circuit and the sensor are easily integrated into one chip. Thus, a manufacturing cost of the sensor is reduced.

Alternatively, the separation wall may be a diffusion layer having the first conductive type.

Alternatively, the separation wall may be a trench separation region having a trench and an insulation film in the trench. Further, the trench separation region may further include a diffusion film having the first conductive type, and the diffusion film covers an inner wall of the trench so that the insulation film is disposed in the trench through the diffusion film. In this case, a PN junction between the diffusion film and the semiconductor region limits carrier fluctuation in the semiconductor region.

Alternatively, the substrate may further include a support substrate and an insulation layer. The semiconductor substrate, the insulation layer and the support substrate are stacked in this order, and the semiconductor region is disposed in the semiconductor substrate. Further, the support substrate may have a predetermined fixed electric potential. In this case, a noise derived from down side of the substrate can be shielded so that the Hall element is protected from the noise.

Alternatively, the sensor may further include first and second separation walls disposed in the substrate and connected to each other. The substrate includes a support substrate having a first conductive type and a semiconductor layer having a second conductive type. The semiconductor layer is disposed on the support substrate. The semiconductor region is disposed in the semiconductor layer. The first separation wall surrounds the semiconductor region so that the first separation wall electrically separates the semiconductor region from the semiconductor layer. The second separation wall is disposed in the semiconductor region so that the second separation wall provides a current path near a bottom of the semiconductor region. The second separation wall electrically divides the semiconductor region into first and second semiconductor regions. The one of first electrodes and the first and second terminals are disposed in the first semiconductor region. The other one of first electrodes and the third and fourth terminals are disposed in the second semiconductor region. In this case, the sensor can be manufactured by a conventional bipolar process, which is suitably used for an analog circuit as a driving circuit of the sensor. Thus, the sensor and a periphery circuit are easily integrated. Further, the sensor can be used together with a low noise circuit so that the sensor has a low noise characteristic and high accuracy.

Alternatively, the sensor may further include an embedded layer disposed between the semiconductor layer and the support substrate. The embedded layer has the second conductive type and an impurity concentration higher than an impurity concentration of the semiconductor region. The embedded layer provides the current path, and the second separation wall contacts the embedded layer. In this case, the driving current appropriately flows through the current path.

Alternatively, the first separation wall may have a depth, which is deeper than a depth of the second separation wall.

Alternatively, the sensor may further include first and second separation walls disposed in the substrate and connected to each other. The substrate includes a semiconductor layer having a first conductive type, an insulation layer and a support substrate having a second conductive type. The semiconductor layer, the insulation layer and the support substrate are stacked in this order. The semiconductor region is disposed in the semiconductor layer. The first separation wall surrounds the semiconductor region so that the first separation wall electrically separates the semiconductor region from the semiconductor layer. The second separation wall is disposed in the semiconductor region so that the second separation wall provides a current path near a bottom of the semiconductor region. The second separation wall electrically divides the semiconductor region into first and second semiconductor regions. The one of first electrodes and the first and second terminals are disposed in the first semiconductor region, and the other one of first electrodes and the third and fourth terminals are disposed in the second semiconductor region. Further, the support substrate may have a predetermined fixed electric potential.

Alternatively, the sensor may further include a planar electrode disposed on the surface of the substrate. The planar electrode is electrically separated from the substrate with an insulation film. Further, the planar electrode may cover at least the semiconductor region, and the planar electrode has a predetermined fixed electric potential.

Alternatively, the sensor may further include a field oxide film having a LOCOS structure disposed on the surface of the substrate. The field oxide film covers at least the semiconductor region.

Alternatively, the sensor may further include a first conductive type film disposed on the surface of the substrate. The first conductive type film covers at least the semiconductor region.

Alternatively, the sensor may further include: a plurality of semiconductor regions; a plurality of magnetic field detection portions disposed in the semiconductor regions; a plurality of pairs of first electrodes disposed on the surface of the semiconductor region; and a plurality of two pairs of second electrodes disposed on the surface of the semiconductor region. Each magnetic field detection portion, each pair of first electrodes and each two pairs of second electrodes provide a vertical Hall element so that a plurality of vertical Hall elements are disposed in the substrate, and the vertical Hall elements are electrically coupled in parallel together so that an offset voltage of the sensor is reduced. Further, one line connecting between the first electrodes in one of the vertical Hall elements may be in parallel to another line connecting between the first electrodes in another one of the vertical Hall elements. Furthermore, the substrate may provide a semiconductor chip having four sides, and an angle between the one line in the one of the vertical Hall elements and one side of the semiconductor chip is almost 45 degrees.

Alternatively, one line connecting between the first electrodes in one of the vertical Hall elements may be perpendicular to another line connecting between the first electrodes in another one of the vertical Hall elements. Further, the sensor may further include a lateral Hall element for detecting a magnetic field perpendicular to the surface of the substrate. Each vertical Hall element detects the magnetic field in parallel to the surface of the substrate, and the vertical Hall elements and the lateral Hall element detect the magnetic field three-dimensionally. Alternatively, the first electrodes in the one of the vertical Hall elements may be in common with the first electrodes in the another one of the vertical Hall elements.

According to a second aspect of the present disclosure, a magnetic sensor includes: a substrate; a semiconductor region disposed in the substrate and having a predetermined conductive type; a magnetic field detection portion disposed in the semiconductor region; a first electrode having first, second and third pads, which are disposed on a surface of the semiconductor region and aligned on a line connecting between the first and third pads so that the first and third pads sandwich the second pad; and a second electrode having first to sixth terminals disposed on the surface of the semiconductor region, wherein the first and second terminals sandwich the first pad, the third and fourth terminals sandwich the second pad, and the fifth and sixth terminals sandwich the third pad. The first, third and fifth terminals are disposed on one side of a line connecting between the first and third pads, and the second, fourth and sixth terminals are disposed on the other side of the line. The first, fourth and fifth terminals are electrically coupled with a seventh wiring, and the second, third and sixth terminals are electrically coupled with an eighth wiring. The magnetic field detection portion, the first electrode and the second electrode provide a vertical Hall element. The vertical Hall element generates a Hall voltage corresponding to a magnetic field when the magnetic field in parallel to the surface of the substrate is applied to the magnetic field detection portion, and a driving current is supplied to the magnetic field detection portion. One of the first and second electrodes supplies the driving current, and the other one of the first and second electrodes detects the Hall voltage.

In the above sensor, the Hall voltage is detected by switching the first and second electrodes between a driving current supply electrode and a Hall voltage detecting electrode so that an offset voltage of the sensor is reduced.

Alternatively, the first and second terminals may be arranged in a line symmetrical manner with respect to the line connecting between the first and third pads, the third and fourth terminals may be arranged in a line symmetrical manner with respect to the line, and the fifth and sixth terminals may be arranged in a line symmetrical manner with respect to the line.

Alternatively, the sensor may further include a separation wall disposed in the semiconductor region. The substrate includes a semiconductor substrate having a first conductive type. The semiconductor region is a diffusion layer having a second conductive type. The separation wall has a depth, which is sallower than a depth of the semiconductor region. The separation wall electrically divides the semiconductor region into first to third semiconductor regions. The first pad and the first and second terminals are disposed in the first semiconductor region. The second pad and the third and fourth terminals are disposed in the second semiconductor region. The third pad and the fifth and sixth terminals are disposed in the third semiconductor region.

According to a third aspect of the present disclosure, a method for detecting a magnetic field includes: supplying a driving current to a magnetic field detection portion, wherein the magnetic field detection portion is disposed in a semiconductor region having a predetermined conductive type, and wherein the semiconductor region is disposed in a substrate; and detecting a Hall voltage corresponding to the magnetic field, which is in parallel to a surface of the substrate and applied to the magnetic field detection portion. A pair of first electrodes is disposed on a surface of the semiconductor region. Two pairs of second electrodes are disposed on the surface of the semiconductor region. One pair of second electrodes sandwiches one of first electrodes, and the other pair of second electrodes sandwiches the other one of first electrodes. The one pair of second electrodes includes first and second terminals, and the other pair of second electrodes includes third and fourth terminals. The first and third terminals are disposed on one side of a line connecting between the first electrodes, and the second and fourth terminals are disposed on the other side of the line. The first and fourth terminals are electrically coupled with a first wiring, and the second and third terminals are electrically coupled with a second wiring. The magnetic field detection portion, the first electrodes and the second electrodes provide a vertical Hall element. The driving current is supplied to the magnetic field detection portion through one of the first and second electrodes so that the one of the first and second electrodes provides a driving current supply electrode. The Hall voltage is detected through the other one of the first and second electrodes so that the other one of the first and second electrodes provides a Hall voltage detecting electrode. The method further includes: switching the one of the first and second electrodes from the driving current supply electrode to the Hall voltage detecting electrode, and switching the other one of the first and second electrodes from the Hall voltage detecting electrode to the driving current supply electrode.

In the above method, the Hall voltage is detected by switching the first and second electrodes between a driving current supply electrode and a Hall voltage detecting electrode so that an offset voltage of the sensor is reduced.

Alternatively, the driving current may be a predetermined constant current. Alternatively, the first and second terminals may be arranged in a line symmetrical manner with respect to the line connecting between the first electrodes, and the third and fourth terminals may be arranged in a line symmetrical manner with respect to the line.

According to a fourth aspect of the present disclosure, a method for detecting a magnetic field includes: supplying a driving current to a magnetic field detection portion, wherein the magnetic field detection portion is disposed in a semiconductor region having a predetermined conductive type, and wherein the semiconductor region is disposed in a substrate; and detecting a Hall voltage corresponding to the magnetic field, which is in parallel to a surface of the substrate and applied to the magnetic field detection portion. A first electrode includes first, second and third pads, which are disposed on a surface of the semiconductor region and aligned on a line connecting between the first and third pads so that the first and third pads sandwich the second pad. A second electrode includes first to sixth terminals disposed on the surface of the semiconductor region. The first and second terminals sandwich the first pad, the third and fourth terminals sandwich the second pad, and the fifth and sixth terminals sandwich the third pad. The first, third and fifth terminals are disposed on one side of a line connecting between the first and third pads, and the second, fourth and sixth terminals are disposed on the other side of the line. The first, fourth and fifth terminals are electrically coupled with a seventh wiring, and the second, third and sixth terminals are electrically coupled with an eighth wiring. The magnetic field detection portion, the first electrode and the second electrode provide a vertical Hall element. The driving current is supplied to the magnetic field detection portion through one of the first and second electrodes so that the one of the first and second electrodes provides a driving current supply electrode. The Hall voltage is detected through the other one of the first and second electrodes detects the Hall voltage so that the other one of the first and second electrodes provides a Hall voltage detecting electrode. The method further includes: switching the one of the first and second electrodes from the driving current supply electrode to the Hall voltage detecting electrode, and switching the other one of the first and second electrodes from the Hall voltage detecting electrode to the driving current supply electrode.

In the above method, the Hall voltage is detected by switching the first and second electrodes between a driving current supply electrode and a Hall voltage detecting electrode so that an offset voltage of the sensor is reduced.

While the invention has been described with reference to preferred embodiments thereof, it is to be understood that the invention is not limited to the preferred embodiments and constructions. The invention is intended to cover various modification and equivalent arrangements. In addition, while the various combinations and configurations, which are preferred, other combinations and configurations, including more, less or only a single element, are also within the spirit and scope of the invention.

What is claimed is:

1. A magnetic sensor comprising:
   a substrate;
   a semiconductor region disposed in the substrate and having a predetermined conductive type;
   a magnetic field detection portion disposed in the semiconductor region;
   a pair of first electrodes disposed on a surface of the semiconductor region; and
   two pairs of second electrodes disposed on the surface of the semiconductor region, wherein one pair of second electrodes sandwiches one of first electrodes, and the other pair of second electrodes sandwiches the other one of first electrodes, wherein
   the one pair of second electrodes includes first and second terminals, and the other pair of second electrodes includes third and fourth terminals,
   the first and third terminals are disposed on one side of a line connecting between the first electrodes, and the second and fourth terminals are disposed on the other side of the line, the first and fourth terminals are electrically coupled with a first wiring, and the second and third terminals are electrically coupled with a second wiring, the magnetic field detection portion, the first electrodes and the second electrodes provide a vertical Hall element, the vertical Hall element generates a Hall voltage corresponding to a magnetic field when the magnetic field in parallel to the surface of the substrate is applied to the magnetic field detection portion, and a driving current is supplied to the magnetic field detection portion, one of the first and second electrodes supplies the driving current, and the other one of the first and second electrodes detects the Hall voltage, a distance between the first and third terminals is substantially equal to a distance between the second and fourth terminals, and a distance between the first electrodes is longer than the distance between the first and third terminals.

2. A magnetic sensor comprising:

a substrate;

a semiconductor region disposed in the substrate and having a predetermined conductive type;

a magnetic field detection portion disposed in the semiconductor region;

a pair of first electrodes disposed on a surface of the semiconductor region; and two pairs of second electrodes disposed on the surface of the semiconductor region, wherein one pair of second electrodes sandwiches one of first electrodes, and the other pair of second electrodes sandwiches the other one of first electrodes, wherein the one pair of second electrodes includes first and second terminals, and the other pair of second electrodes includes third and fourth terminals, the first and third terminals are disposed on one side of a line connecting between the first electrodes, and the second and fourth terminals are disposed on the other side of the line, the first and fourth terminals are electrically coupled with a first wiring, and the second and third terminals are electrically coupled with a second wiring, the magnetic field detection portion, the first electrodes and the second electrodes provide a vertical Hall element, the vertical Hall element generates a Hall voltage corresponding to a magnetic field when the magnetic field in parallel to the surface of the substrate is applied to the magnetic field detection portion, and a driving current is supplied to the magnetic field detection portion, one of the first and second electrodes supplies the driving current, and the other one of the first and second electrodes detects the Hall voltage, the one pair of second electrodes further includes fifth and sixth terminals, and the other pair of second electrodes further includes seventh and eighth terminals, the fifth and sixth terminals sandwich the first and second terminals and the one of first electrodes, and the seventh and eighth terminals sandwich the third and fourth terminals and the other one of first electrodes, the fifth and seventh terminals are disposed on the one side of the line connecting between the first electrodes, and the sixth and eighth terminals are disposed on the other side of the line, and the fifth and eighth terminals are electrically coupled with a third wiring, and the sixth and seventh terminals are electrically coupled with a fourth wiring.

3. A method for detecting a magnetic field comprising:

supplying a driving current to a magnetic field detection portion, wherein the magnetic field detection portion is disposed in a semiconductor region having a predetermined conductive type, and wherein the semiconductor region is disposed in a substrate; and detecting a Hall voltage corresponding to the magnetic field, which is in parallel to a surface of the substrate and applied to the magnetic field detection portion, wherein a first electrode includes first, second and third pads, which are disposed on a surface of the semiconductor region and aligned on a line connecting between the first and third pads so that the first and third pads sandwich the second pad, a second electrode includes first to sixth terminals disposed on the surface of the semiconductor region, the first and second terminals sandwich the first pad, the third and fourth terminals sandwich the second pad, and the fifth and sixth terminals sandwich the third pad, the first, third and fifth terminals are disposed on one side of a line connecting between the first and third pads, and the second, fourth and sixth terminals are disposed on the other side of the line, the first, fourth and fifth terminals are electrically coupled with a seventh wiring, and the second, third and sixth terminals are electrically coupled with an eighth wiring, the magnetic field detection portion, the first electrode and the second electrode provide a vertical Hall element, the driving current is supplied to the magnetic field detection portion through one of the first and second electrodes so that the one of the first and second electrodes provides a driving current supply electrode, and the Hall voltage is detected through the other one of the first and second electrodes detects the Hall voltage so that the other one of the first and second electrodes provides a Hall voltage detecting electrode, the method further comprising: switching the one of the first and second electrodes from the driving current supply electrode to the Hall voltage detecting electrode, and switching the other one of the first and second electrodes from the Hall voltage detecting electrode to the driving current supply electrode.

4. The method according to claim 3, wherein the driving current is a predetermined constant current.

5. The sensor according to claim 3, wherein the first and second terminals are arranged in a line symmetrical manner with respect to the line connecting between the first and third pads, the third and fourth terminals are arranged in a line symmetrical manner with respect to the line, and the fifth and sixth terminals are arranged in a line symmetrical manner with respect to the line.

6. A magnetic sensor comprising:

a substrate;

a semiconductor region disposed in the substrate and having a predetermined conductive type;

a magnetic field detection portion disposed in the semiconductor region;

a pair of first electrodes disposed on a surface of the semiconductor region;

two pairs of second electrodes disposed on the surface of the semiconductor region, wherein one pair of second electrodes sandwiches one of first electrodes, and the other pair of second electrodes sandwiches the other one of first electrodes; and a separation wall disposed in the semiconductor region, wherein the one pair of second electrodes includes first and second terminals, and the other pair of second electrodes includes third and fourth terminals, the first and third terminals are disposed on one side of a line connecting between the first electrodes, and the second and fourth terminals are disposed on the other side of the line, the first and fourth terminals are electrically coupled with a first wiring, and the second and third terminals are electrically coupled with a second wiring, the magnetic field detection portion, the first electrodes and the second electrodes provide a vertical Hall element, the vertical Hall element generates a Hall voltage corresponding to a magnetic field when the magnetic field in parallel to the surface of the substrate is applied to the magnetic field detection portion, and a driving current is supplied to the magnetic field detection portion, one of the first and second electrodes supplies the driving current, and the other one of the first and second electrodes detects the Hall voltage, the substrate includes a semiconductor substrate having a first conductive type, the semiconductor region is a diffusion layer having a second conductive type, the separation wall has a depth, which is shallower than a depth of the semiconductor region, the separation wall electrically divides the semiconductor region into first and second semiconductor regions, the one of first electrodes and the first and second terminals are disposed in the first semiconductor region, and the other one of first electrodes and the third and fourth terminals are disposed in the second semiconductor region.

7. The sensor according to claim 6, wherein
the separation wall is a diffusion layer having the first conductive type.

8. The sensor according to claim 6, wherein
the separation wall is a trench separation region having a trench and an insulation film in the trench.

9. The sensor according to claim 8, wherein
the trench separation region further includes a diffusion film having the first conductive type, and
the diffusion film covers an inner wall of the trench so that the insulation film is disposed in the trench through the diffusion film.

10. The sensor according to claim 6, wherein
the substrate further includes a support substrate and an insulation layer,
the semiconductor substrate, the insulation layer and the support substrate are stacked in this order, and
the semiconductor region is disposed in the semiconductor substrate.

11. The sensor according to claim 5, wherein
the support substrate has a predetermined fixed electric potential.

12. A magnetic sensor comprising:
a substrate;
a semiconductor region disposed in the substrate and having a predetermined conductive type;
a magnetic field detection portion disposed in the semiconductor region;
a pair of first electrodes disposed on a surface of the semiconductor region;
two pairs of second electrodes disposed on the surface of the semiconductor region, wherein one pair of second electrodes sandwiches one of first electrodes, and the other pair of second electrodes sandwiches the other one of first electrodes; and first and second separation walls disposed in the substrate and connected to each other, wherein the one pair of second electrodes includes first and second terminals, and the other pair of second electrodes includes third and fourth terminals, the first and third terminals are disposed on one side of a line connecting between the first electrodes, and the second and fourth terminals are disposed on the other side of the line, the first and fourth terminals are electrically coupled with a first wiring, and the second and third terminals are electrically coupled with a second wiring, the magnetic field detection portion, the first electrodes and the second electrodes provide a vertical Hall element, the vertical Hall element generates a Hall voltage corresponding to a magnetic field when the magnetic field in parallel to the surface of the substrate is applied to the magnetic field detection portion, and a driving current is supplied to the magnetic field detection portion, one of the first and second electrodes supplies the driving current, and the other one of the first and second electrodes detects the Hall voltage, the substrate includes a support substrate having a first conductive type and a semiconductor layer having a second conductive type, the semiconductor layer is disposed on the support substrate, the semiconductor region is disposed in the semiconductor layer, the first separation wall surrounds the semiconductor region so that the first separation wall electrically separates the semiconductor region from the semiconductor layer, the second separation wall is disposed in the semiconductor region so that the second separation wall provides a current path near a bottom of the semiconductor region, the second separation wall electrically divides the semiconductor region into first and second semiconductor regions, the one of first electrodes and the first and second terminals are disposed in the first semiconductor region, and the other one of first electrodes and the third and fourth terminals are disposed in the second semiconductor region.

13. The sensor according to claim 12, further comprising:
an embedded layer disposed between the semiconductor layer and the support substrate, wherein
the embedded layer has the second conductive type and an impurity concentration higher than an impurity concentration of the semiconductor region,
the embedded layer provides the current path, and
the second separation wall contacts the embedded layer.

14. The sensor according to claim 12, wherein
the second separation wall is a diffusion layer having the first conductive type.

15. The sensor according to claim 12, wherein
the second separation wall is a trench separation region having a trench and an insulation film in the trench.

16. The sensor according to claim 12, wherein
the first separation wall has a depth, which is deeper than a depth of the second separation wall.

17. A magnetic sensor comprising:
a substrate;
a semiconductor region disposed in the substrate and having a predetermined conductive type;
a magnetic field detection portion disposed in the semiconductor region;
a pair of first electrodes disposed on a surface of the semiconductor region;
two pairs of second electrodes disposed on the surface of the semiconductor region, wherein one pair of second electrodes sandwiches one of first electrodes, and the other pair of second electrodes sandwiches the other one of first electrodes; and
first and second separation walls disposed in the substrate and connected to each other, wherein
the one pair of second electrodes includes first and second terminals, and the other pair of second electrodes includes third and fourth terminals,
the first and third terminals are disposed on one side of a line connecting between the first electrodes, and the second and fourth terminals are disposed on the other side of the line,
the first and fourth terminals are electrically coupled with a first wiring, and the second and third terminals are electrically coupled with a second wiring,
the magnetic field detection portion, the first electrodes and the second electrodes provide a vertical Hall element,
the vertical Hall element generates a Hall voltage corresponding to a magnetic field when the magnetic field in parallel to the surface of the substrate is applied to the magnetic field detection portion, and a driving current is supplied to the magnetic field detection portion,
one of the first and second electrodes supplies the driving current, and the other one of the first and second electrodes detects the Hall voltage,
the substrate includes a semiconductor layer having a first conductive type, an insulation layer and a support substrate having a second conductive type,
the semiconductor layer, the insulation layer and the support substrate are stacked in this order,
the semiconductor region is disposed in the semiconductor layer,
the first separation wall surrounds the semiconductor region so that the first separation wall electrically separates the semiconductor region from the semiconductor layer,
the second separation wall is disposed in the semiconductor region so that the second separation wall provides a current path near a bottom of the semiconductor region,
the second separation wall electrically divides the semiconductor region into first and second semiconductor regions,
the one of first electrodes and the first and second terminals are disposed in the first semiconductor region, and
the other one of first electrodes and the third and fourth terminals are disposed in the second semiconductor region.

18. The sensor according to claim 17, wherein
the support substrate has a predetermined fixed electric potential.

19. The sensor according to claim 17, wherein
the first and second separation walls are diffusion layers having the first conductive type.

20. The sensor according to claim 17, wherein
the first and second separation walls are trench separation regions having a trench and an insulation film in the trench.

21. The sensor according to claim 20, wherein
the trench separation region further includes a diffusion film having the first conductive type, and
the diffusion film covers an inner wall of the trench so that the insulation film is disposed in the trench through the diffusion film.

22. The sensor according to claim 17, wherein
the first separation wall has a depth, which is deeper than a depth of the second separation wall.

23. A magnetic sensor comprising:
a substrate;
a semiconductor region disposed in the substrate and having a predetermined conductive type;
a magnetic field detection portion disposed in the semiconductor region;
a pair of first electrodes disposed on a surface of the semiconductor region; and
two pairs of second electrodes disposed on the surface of the semiconductor region, wherein
the one pair of second electrodes includes first and second terminals, and the other pair of second electrodes includes third and fourth terminals,
the first and third terminals are disposed on one side of a line connecting between the first electrodes, and the second and fourth terminals are disposed on the other side of the line,
the first and fourth terminals are electrically coupled with a first wiring, and the second and third terminals are electrically coupled with a second wiring,
the magnetic field detection portion, the first electrodes and the second electrodes provide a vertical Hall element,
the vertical Hall element generates a Hall voltage corresponding to a magnetic field when the magnetic field in parallel to the surface of the substrate is applied to the magnetic field detection portion, and a driving current is supplied to the magnetic field detection portion,
one of the first and second electrodes supplies the driving current, and the other one of the first and second electrodes detects the Hall voltage,
the one of first electrodes includes first, second and third pads, and the other one of first electrodes includes fourth, fifth and sixth pads,
the first and second terminals sandwich the first pad, and the third and fourth terminals sandwich the fourth pad,
the second and third pads sandwich the first and second terminals and the first pad, and the fifth and sixth pads sandwich the third and fourth terminals and the fourth pad,
the first and third terminals and the second and fifth pads are disposed on the one side of the line connecting between the first and fourth pads, and the second and fourth terminals and the third and sixth pads are disposed on the one side of the line, and
the first, fifth and sixth pads are electrically coupled with a fifth wiring, and the second, third and fourth pads are electrically coupled with a sixth wiring.

24. A magnetic sensor comprising:
a substrate;
a semiconductor region disposed in the substrate and having a predetermined conductive type;
a magnetic field detection portion disposed in the semiconductor region;
a pair of first electrodes disposed on a surface of the semiconductor region;
two pairs of second electrodes disposed on the surface of the semiconductor region, wherein one pair of second electrodes sandwiches one of first electrodes, and the other pair of second electrodes sandwiches the other one of first electrodes;
a plurality of semiconductor regions;
a plurality of magnetic field detection portions disposed in the semiconductor regions;
a plurality of pairs of first electrodes disposed on the surface of the semiconductor region; and
a plurality of two pairs of second electrodes disposed on the surface of the semiconductor region, wherein
the one pair of second electrodes includes first and second terminals, and the other pair of second electrodes includes third and fourth terminals,
the first and third terminals are disposed on one side of a line connecting between the first electrodes, and the second and fourth terminals are disposed on the other side of the line,
the first and fourth terminals are electrically coupled with a first wiring, and the second and third terminals are electrically coupled with a second wiring,
the magnetic field detection portion, the first electrodes and the second electrodes provide a vertical Hall element,
the vertical Hall element generates a Hall voltage corresponding to a magnetic field when the magnetic field in parallel to the surface of the substrate is applied to the magnetic field detection portion, and a driving current is supplied to the magnetic field detection portion,
one of the first and second electrodes supplies the driving current, and the other one of the first and second electrodes detects the Hall voltage,
each magnetic field detection portion, each pair of first electrodes and each two pairs of second electrodes provide a vertical Hall element so that a plurality of vertical Hall elements are disposed in the substrate,
the vertical Hall elements are electrically coupled in parallel together so that an offset voltage of the sensor is reduced,
one line connecting between the first electrodes in one of the vertical Hall elements is perpendicular to another line connecting between the first electrodes in another one of the vertical Hall elements, and
the first electrodes in the one of the vertical Hall elements is in common with the first electrodes in the another one of the vertical Hall elements.

25. A magnetic sensor comprising:
a substrate;
a semiconductor region disposed in the substrate and having a predetermined conductive type;
a magnetic field detection portion disposed in the semiconductor region;
a first electrode having first, second and third pads, which are disposed on a surface of the semiconductor region and aligned on a line connecting between the first and third pads so that the first and third pads sandwich the second pad; and
a second electrode having first to sixth terminals disposed on the surface of the semiconductor region, wherein the first and second terminals sandwich the first pad, the third and fourth terminals sandwich the second pad, and the fifth and sixth terminals sandwich the third pad, wherein
the first, third and fifth terminals are disposed on one side of a line connecting between the first and third pads, and the second, fourth and sixth terminals are disposed on the other side of the line, the first, fourth and fifth terminals are electrically coupled with a seventh wiring, and the second, third and sixth terminals are electrically coupled with an eighth wiring,
the magnetic field detection portion, the first electrode and the second electrode provide a vertical Hall element,
the vertical Hall element generates a Hall voltage corresponding to a magnetic field when the magnetic field in parallel to the surface of the substrate is applied to the magnetic field detection portion, and a driving current is supplied to the magnetic field detection portion, and
one of the first and second electrodes supplies the driving current, and the other one of the first and second electrodes detects the Hall voltage.

26. The sensor according to claim 25, wherein
the first and second terminals are arranged in a line symmetrical manner with respect to the line connecting between the first and third pads,
the third and fourth terminals are arranged in a line symmetrical manner with respect to the line, and
the fifth and sixth terminals are arranged in a line symmetrical manner with respect to the line.

27. The sensor according to claim 25, further comprising:
a separation wall disposed in the semiconductor region, wherein
the substrate includes a semiconductor substrate having a first conductive type,
the semiconductor region is a diffusion layer having a second conductive type,
the separation wall has a depth, which is shallower than a depth of the semiconductor region,
the separation wall electrically divides the semiconductor region into first to third semiconductor regions,
the first pad and the first and second terminals are disposed in the first semiconductor region,
the second pad and the third and fourth terminals are disposed in the second semiconductor region, and
the third pad and the fifth and sixth terminals are disposed in the third semiconductor region.

28. The sensor according to claim 27, wherein
the separation wall is a diffusion layer having the first conductive type.

29. The sensor according to claim 27, wherein
the separation wall is a trench separation region having a trench and an insulation film in the trench.

30. The sensor according to claim 27, wherein
the trench separation region further includes a diffusion film having the first conductive type, and
the diffusion film covers an inner wall of the trench so that the insulation film is disposed in the trench through the diffusion film.

31. The sensor according to claim 27, wherein
the substrate further includes a support substrate and an insulation layer,
the semiconductor substrate, the insulation layer and the support substrate are stacked in this order, and
the semiconductor region is disposed in the semiconductor substrate.

32. The sensor according to claim 31, wherein
the support substrate has a predetermined fixed electric potential.

* * * * *